United States Patent [19]
Fujino et al.

[11] Patent Number: 6,151,244
[45] Date of Patent: Nov. 21, 2000

[54] DYNAMIC SEMICONDUCTOR MEMORY DEVICE

[75] Inventors: Takeshi Fujino; Kazutami Arimoto, both of Hyogo, Japan

[73] Assignee: Mitsubishi Denki Kabushiki Kaisha, Tokyo, Japan

[21] Appl. No.: 09/176,029

[22] Filed: Oct. 21, 1998

[30] Foreign Application Priority Data

Mar. 17, 1998 [JP] Japan .................................. 10-067222

[51] Int. Cl.[7] .................................................. G11C 11/24
[52] U.S. Cl. .............................. 365/149; 365/51; 365/63; 365/230.03
[58] Field of Search ............................... 365/149, 51, 63, 365/230.03

[56] References Cited

U.S. PATENT DOCUMENTS

| | | | |
|---|---|---|---|
| 5,291,432 | 3/1994 | Furutani ..................................... | 365/51 |
| 5,383,151 | 1/1995 | Onishi et al. ............................ | 365/149 |
| 5,566,104 | 10/1996 | Shinkawata ................................ | 365/51 |
| 5,699,308 | 12/1997 | Wada et al. ................................ | 365/63 |
| 5,708,620 | 1/1998 | Jeong ......................................... | 365/63 |
| 5,764,562 | 6/1998 | Hamamoto ................................. | 365/63 |
| 5,815,428 | 9/1998 | Tsuruda et al. ............................ | 365/63 |

OTHER PUBLICATIONS

"A Staggered NAND DRAM array architecture for a Gbit scale integration", S. Shiratake et al., 1994 Symposium on VLSI Circuits Digest of Technical Papers, pp. 75–76.

"Cell–Plate–Line and Bit–Line Complementarily Sensed (CBCS) Architecture for Ultra Low–Power Non–Destructive DRAMs", T. Hamamoto et al., 1995 Symposium on VLSI Circuits Digest of Technical Papers, pp. 79–80.

"An Experimental DRAM with a NAND–Structured Cell", T. Hasegawa et al., IEEE Journal of Solid–State Circuits, vol. 28, No. 11, Nov. 1993, pp. 1099–1103.

*Primary Examiner*—Son T. Dinh
*Attorney, Agent, or Firm*—McDermott, Will & Emery

[57] ABSTRACT

Memory cell minimum units (MCU) formed of multi-bit one transistor/one capacitor type memory cells are repeatedly arranged in a column direction, and bit line contacts (BCT) are shifted in the column direction relative to a row direction. The bit line contacts are repeatedly shifted with a prescribed number of bit lines as a unit. A set of a read bit line onto which memory cell data are read and a reference bit line supplying a reference potential can be obtained by controlling the voltage of cell plate lines and bit lines for each set of bit lines. Accordingly, a memory cell occupation area can be reduced and sensing operation in the folded bit line arrangement is possible. Consequently, a memory cell occupation area per one bit can be dramatically reduced and sensing operation in the folded bit line arrangement can be performed.

16 Claims, 24 Drawing Sheets

| SL1 | SL2 | SL3 | SL4 | BCCa | BCCb | BCCc | WLA | WLB | WLC | CPCa | CPCb | CPCc |
|---|---|---|---|---|---|---|---|---|---|---|---|---|
|  | H |  | H |  | H | H |  |  |  |  |  | H |
|  |  | H | H | H |  |  | H |  |  | H |  |  |
| H |  | H |  | H |  |  |  | H |  |  | H |  |
|  |  | H | H | H |  |  |  | H |  | H |  |  |
|  | H |  | H |  | H |  |  |  | H |  |  | H |
| H | H |  |  | H |  |  |  |  | H | H |  |  |

| SELECTED WORD LINE | WLA | WLA | WLB | WLB | WLC | WLC |
|---|---|---|---|---|---|---|
| READ BIT LINE | BLA | BLC | BLA | BLB | BLB | BLC |
| REFERENCE BIT LINE | BLB | BLB | BLC | BLC | BLA | BLA |
| DATA RETENTION BIT LINE | BLC | BLA | BLB | BLA | BLC | BLB |

↖ BLA IS CONNECTED TO ADJACENT ↗
SENSE AMPLIFIER

FIG. 30

| READ CELL | SL A | SL B | SL C | SL D | BCC A | BCC B | BCC C | BCC D | WL 0 | WL 1 | WL 2 | WL 3 | WL 4 | WL 5 | WL 6 | WL 7 | WL 8 | WL 9 | WL 10 | WL 11 | WL 12 | WL 13 | CPC A | CPC B | CPC C | CPC D |
|---|---|---|---|---|---|---|---|---|---|---|---|---|---|---|---|---|---|---|---|---|---|---|---|---|---|---|
| A1 | H | H |   |   |   |   | H | H | H | H | H | H |   |   |   |   |   |   |   |   |   |   |   | H | H | H |
| A2 | H | H |   |   |   |   | H | H |   |   | H | H |   |   |   |   |   |   |   |   |   |   | H |   | H | H |
| B1 |   | H | H |   |   |   |   | H |   |   |   | H |   |   |   |   | H | H |   |   |   |   | H | H | H |   |
| B2 |   | H | H |   |   |   |   | H |   |   |   |   | H | H |   |   |   |   |   |   |   |   | H | H |   | H |
| C1 |   |   | H | H |   |   |   |   |   |   |   |   | H | H | H | H |   |   |   |   |   |   | H | H |   | H |
| C2 |   |   | H | H |   |   |   |   |   |   |   |   |   |   | H | H |   |   | H | H | H | H |   |   | H | H |
| D1 | H |   |   | H |   | H | H |   |   |   |   |   |   |   | H | H | H | H |   |   |   |   |   | H | H |   |
| D2 | H |   |   | H |   | H | H |   |   |   |   |   | H | H | H | H |   |   |   |   |   |   |   | H | H |   |

| | SELECTED WORD LINE | READ BIT LINE | REFERENCE BIT LINE | WORD LINE SELECTION SEQUENCE SMALL ⟵——• LARGE |
|---|---|---|---|---|
| A { | 9n+3 | BLA | BLB | ⟵——• |
| | 9n+4 | BLA | BLD | •——⟶ |
| B { | 9n+5 | BLB | BLC | ⟵——• |
| | 9n+6 | BLB | BLA | •——⟶ |
| C { | 9n+7 | BLC | BLD | ⟵——• |
| | 9n+8 | BLC | BLB | •——⟶ |
| D { | 9n | BLD | BLA | ⟵——• |
| | 9n+1 | BLD | BLC | •——⟶ |

| SELECTED WORD LINE | READ BIT LINE | REFERENCE BIT LINE | WORD LINE SELECTION SEQUENCE |
|---|---|---|---|
| 5n+1 | BLA | BLD | ←—• |
| 5n+1 | BLC | BLB | •—→ |
| 5n+2 | BLA | BLC | •—→ |
| 5n+2 | BLD | BLB | ←—• |
| 5n+3 | BLB | BLC | ←—• |
| 5n+3 | BLD | BLA | •—→ |
| 5n+4 | BLB | BLA | •—→ |
| 5n | BLC | BLD | ←—• |

DYNAMIC SEMICONDUCTOR MEMORY DEVICE

BACKGROUND OF THE INVENTION

1. Field of the Invention

The present invention relates to a dynamic semiconductor memory device of a large storage capacity. The invention more particularly relates to an arrangement of a memory cell array suitable for higher integration in a dynamic random access memory, and to configuration of peripheral circuitry suitable for the arrangement.

2. Description of the Background Art

FIG. 39 shows a structure of a memory cell of a conventional dynamic random access memory (DRAM). Referring to FIG. 39, a DRAM cell MC includes a capacitor Cm for storing information in a charge form, and an access transistor Tm formed of an n channel MOS transistor responsive to signal potential on a word line WL to connect capacitor Cm to a bit line BL (or /BL).

In a memory cell array, DRAM cells MC are arranged in rows and columns, word line WL is placed corresponding to each row of the memory cells, and a pair of bit lines BL and /BL is placed corresponding to each column of the memory cells. In DRAM cell MC, electric charges corresponding to storage information are accumulated in one electrode node (storage node) SN of capacitor Cm, and a constant voltage Vcp is applied to the other electrode node (cell plate node) CP. Generally, cell plate voltage Vcp is set at a voltage level equal to an amplitude of bit line BL (voltage equal to half a supply voltage Vcc (Vcc/2)).

As shown in FIG. 39, DRAM has a cell MC formed of one transistor and one capacitor (1-transistor/1-capacitor type cell), and it is widely used as a large storage capacity memory such as a main memory of a system since the number of components is small, the occupation area is accordingly reduced and cost per bit is decreased compared with a static random access memory (SRAM) which requires a plurality of transistors for a cell.

FIG. 40 schematically shows an arrangement of memory cells of a conventional DRAM. In FIG. 40, word lines WL0–WL9 and bit lines BL0, /BL0 and BL1, /BL1 are representatively shown.

Referring to FIG. 40, memory cell minimum units MCU each including two memory cells opposite to each other relative to a bit line contact BCT for electrically connecting the memory cells and the bit lines are placed in a row direction and a column direction along a prescribed rule Storage node SN of capacitor Cm of a memory cell (see FIG. 39) is electrically connected to one conductive region of access transistor Tm via a storage node contact SCT. In FIG. 40, a rectangular region AFR is a field region (active region) where the access transistor is formed. Capacitor Cm connected via storage node contact SCT is formed extending over active region AFR to the word lines (stacked capacitor type cell structure).

In the arrangement of memory cells shown in FIG. 40, bit line contacts BCT are formed every other bit line in the row direction. In other words, the memory cells are connected to every other bit line in the row direction (direction in which the word line extends). Bit line contacts BCT of adjacent bit lines are formed at different positions. Bit lines BL0 and /BL0 are arranged in a pair, and bit lines BL1 and /BL1 are arranged in a pair. Accordingly, when one word line is selected, one of the paired bit lines is connected to a memory cell, and the other bit line is not connected to the memory cell.

In the arrangement of memory cells shown in FIG. 40, if the pitch of word lines WL (WL0–WL9) is 2F and the pitch of bit lines (distance between adjacent bit lines) is 2F, memory cell minimum unit MCU occupies an area of 2F·8F. The occupation area of memory cell minimum unit MCU is larger than that of active region AFR since memory cell capacitor CM extends to the outside of active region AFR. Therefore, the occupation area of a one-bit memory cell region UMR is 2F·4F=8·F². The occupation area of memory cells can be sufficiently increased in the arrangement in which memory cells are placed alternately in the row and column direction with bit line contact BCT shared between two memory cells.

FIG. 41 shows a circuit which is electrically equivalent to the memory cell arrangement shown in FIG. 40. Referring to FIG. 41, memory cell minimum units MCU are arranged every two word lines in the column direction, and arranged every other bit line in the row direction. Bit lines BL0 and /BL0 are connected to a sense amplifier SAa provided on one side of the memory cell array (region where memory cells are placed), and bit lines BL1 and /BL1 are connected to a sense amplifier SAb placed on the other side of the memory cell array. Sense amplifiers SAa and SAb differentially amplify the potential of corresponding bit lines. Cell plate nodes CP of capacitors Cm included in memory cells MC are commonly connected to a cell plate line CPL and receive cell plate voltage Vcp. Cell plate line CPL is connected commonly to all memory cells MC on the memory cell array.

When one word line is selected, memory cell data is read onto one of each pair of bit lines, and the other bit line in each pair maintains a precharge voltage. If word line WL7 is selected for example, storage data of a memory cell MCa is read onto bit line BL0, and storage data of a memory cell MCb is read onto bit line BL1. On the other hand, there is no memory cell at crossings of bit lines /BL0 and /BL1 and word line WL7, and the bit lines /BL0 and /BL1 keep the precharge voltage level. Sense amplifiers SAa and SAb amplify the potential of bit lines BL0 and BL1 onto which the memory cell data are read using the voltage of the other bit lines /BL0 and /BL1 as a reference voltage, to sense and amplify the storage data.

The paired bit lines are so arranged as to extend in the same direction relative to a corresponding sense amplifier. Such arrangement of the bit lines is referred to as "folded bit line configuration", which provides high noise immunity and easy layout of sense amplifiers.

Specifically, a read bit line onto which storage data of a memory cell is read and a reference bit line providing a reference potential for the read data are arranged to be physically adjacent to each other in the same memory array. As a result, difference in interconnection capacitance of paired bit lines is small and the capacitance of sense nodes of sense amplifiers SAa and SAb is equal so that an accurate sensing operation is achieved.

Further, regarding the sense amplifier, locally generated noises are common mode noises for the paired bit lines to be canceled by a corresponding sense amplifier since the bit lines are arranged to extend in the same direction. Consequently, the noise immunity is increased and accurate sensing and amplifying of memory cell data are possible.

In addition, sense amplifiers SAa and SAb can be arranged alternately on both sides of the bit lines. Accordingly, one sense amplifier may be provided per four bit lines so that the pitch condition of the sense amplifiers is relaxed and the sense amplifiers can be easily arranged even in a highly integrated memory cell array.

In the case of the folded bit line configuration shown in FIGS. 40 and 41, one memory cell is placed per two bit lines in the row direction, and one memory cell is placed per two word lines in the column direction. In other words, one memory cell is arranged per four crossings of word lines and bit lines. A highly integrated DRAM of a large storage capacity is implemented by the micro-lithography. However, the minimum processing dimension of a memory cell for a large storage capacity memory such as the recent 64M bit DRAM and 256M bit DRAM decreases to 0.25 μm or less. Since the required minimum capacitance value of capacitor Cm is determined considering the relation with the bit line load capacitance for transmitting a sufficient read voltage onto a corresponding bit line, miniaturization of a memory cell is limited. Therefore, it is increasingly difficult to arrange memory cells to be highly integrated in a memory cell array using a miniaturization technique.

Memory cells can be arranged in a high density if occupation area per one bit of memory cell can be reduced with the minimum processing dimension unchanged.

FIG. 42 shows an example of a possible arrangement of memory cells. Active region AFR in the array arrangement of memory cells shown in FIG. 42 includes two memory transistors similarly to the arrangement of memory cells shown in FIG. 40. Memory cell minimum unit MCU accordingly includes two memory cells. Active regions AFR are so arranged in the row and column directions as to allow bit line contacts BCT to be aligned in the row direction. In the column direction, memory cell minimum unit MCU is repeatedly placed. Word lines WL0–WL5 are arranged to cross access transistors of active regions AFR. No word line is placed between adjacent memory cell minimum units MC.

According to the array arrangement shown in FIG. 42, bit line contacts BCT are arranged in alignment in the row direction, and active regions AFR are also arranged in alignment in the row direction. Accordingly, memory cells are arranged corresponding to respective crossings of word lines WL (WL0–WL5) and bit lines BL (BL0–BL3). If the pitches of word lines WL and bit lines BL are both 2F, the occupation area of one-bit memory cell region UMR is 6. F2. Consequently, the occupation area of a memory cell of one bit can be decreased by about 25% compared with the folded bit line arrangement shown in FIG. 40, and a highly integrated arrangement of memory cells is achieved to allow more memory cells to be placed in the same array area.

FIG. 43 shows a circuit electrically equivalent to the memory cell arrangement shown in FIG. 42. Referring to FIG. 43, DRAM cells MC are arranged corresponding to respective crossings of word lines WL0–WL5 and bit lines BL0–BL3. Memory cell minimum units MCU are arranged in alignment in the row and column directions. Cell plate nodes of DRAM cells MC are commonly connected to cell plate line CPL to receive cell plate voltage Vcp. When one word line is selected, memory cell data are read onto respective bit lines BL0–BL3. In order to sense and amplify the data of selected memory cells, sense amplifiers SA0–SA3 are arranged corresponding to respective bit lines BL0–BL3. These sense amplifiers SA0–SA3 respectively perform sensing operation using bit lines BL0a–BL3a in the same column of an adjacent memory cell array as bit lines that apply a reference potential.

The configuration where memory cells are arranged corresponding to respective crossings of word lines and bit lines is referred to as "open bit line arrangement." When noises are locally generated in the memory cell array including bit lines BL0–BL3, the noises are not transmitted to the adjacent memory array. As a result, sense amplifiers SA0–SA3 cannot cancel the influence of the noises, and not accurately read data, resulting in a lowered noise immunity.

The sense amplifier generally includes cross-coupled p channel MOS transistors and cross-coupled n channel MOS transistors. In other words, the sense amplifier includes at least 4 MOS transistors as its components. Sense amplifiers SA0–SA3 should be arranged corresponding to respective bit lines BL0–BL3, and the pitch of the sense amplifiers equals to that of the bit lines. As a result, it is difficult to arrange sense amplifiers having a relatively large occupation area (since the pitch of the bit lines becomes extremely small for increasing integration). Therefore, the array arrangement shown in FIGS. 42 and 43 cannot be applied for increase of integration of a large storage capacity memory such as the 64M bit DRAM and 256M bit DRAM.

SUMMARY OF THE INVENTION

One object of the present invention is to provide a semiconductor memory device having a memory cell arrangement suitable for higher integration.

Another object of the present invention is to provide a semiconductor memory device having the folded bit line arrangement suitable for higher density and higher integration.

Still another object of the present invention is to provide a semiconductor memory device having the folded bit line arrangement suitable for higher density and higher integration allowing an easy layout of sense amplifiers.

Briefly stated, a semiconductor memory device according to the present invention includes memory cells of 1-transistor/1-capacitor type arranged periodically in row direction and shifted in a column direction and bit lines with a set of a prescribed number of bit lines being a unit and repeatedly arranged in the row direction. Data of a memory cell is read onto one of the bit lines of the set, and reading of data of a memory cell onto remaining bit lines is inhibited by changing a voltage level of a cell plate node of the memory cell connected to each of the remaining bit lines.

The memory cells are arranged periodically in the row direction and shifted in the column direction. Therefore, compared with the conventional folded bit line configuration, memory cells can be arranged at more crossings of word lines and bit lines to reduce an occupation area per one bit of memory cells.

In addition, bit line voltage and cell plate voltage in each column is individually controlled, so that access transistors of memory cells connected to a selected word line can be selectively set into OFF state. Accordingly, a pair of a read bit line having memory cell data read thereonto and a reference bit line applying a reference potential can be arranged implementing the folded bit line configuration.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 30 shows in a table correspondence between a selected word line and each control signal in the structure shown in FIGS. 28 and 29.

DESCRIPTION OF THE PREFERRED EMBODIMENTS (First Embodiment)

Figure 1:
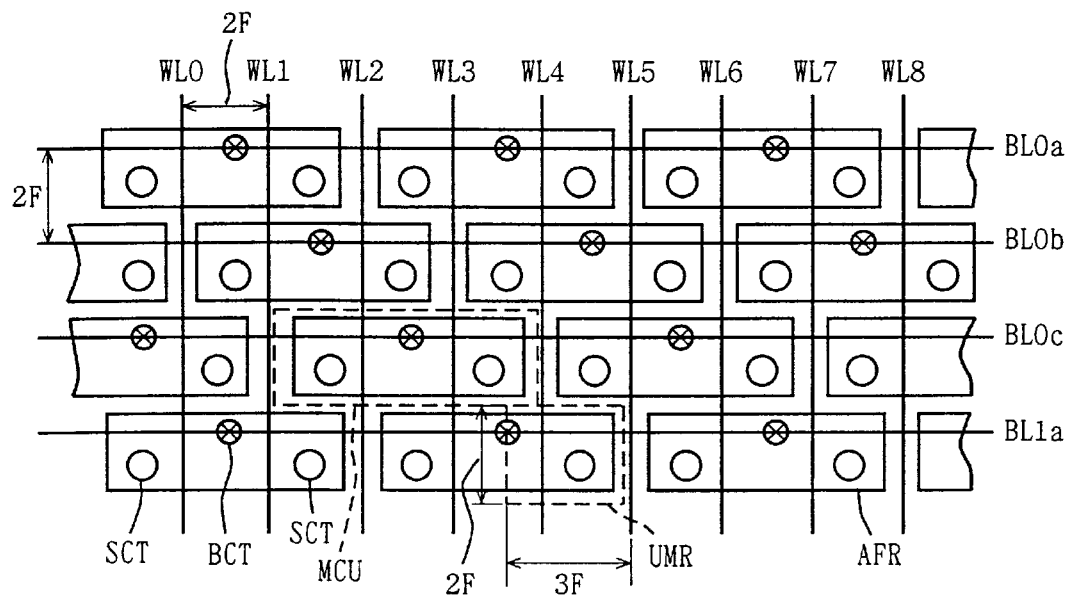
FIG. 1 schematically shows a memory cell arrangement of a semiconductor memory device according to the first embodiment of the invention.

FIG. 1 schematically shows a configuration of a memory cell array portion of a semiconductor memory device according to the first embodiment of the invention. In FIG. 1, memory cells arranged at crossings of nine word lines WL0–WL8 and four bit lines BL0a–BL0c and BL1a are shown.

Figure 42:
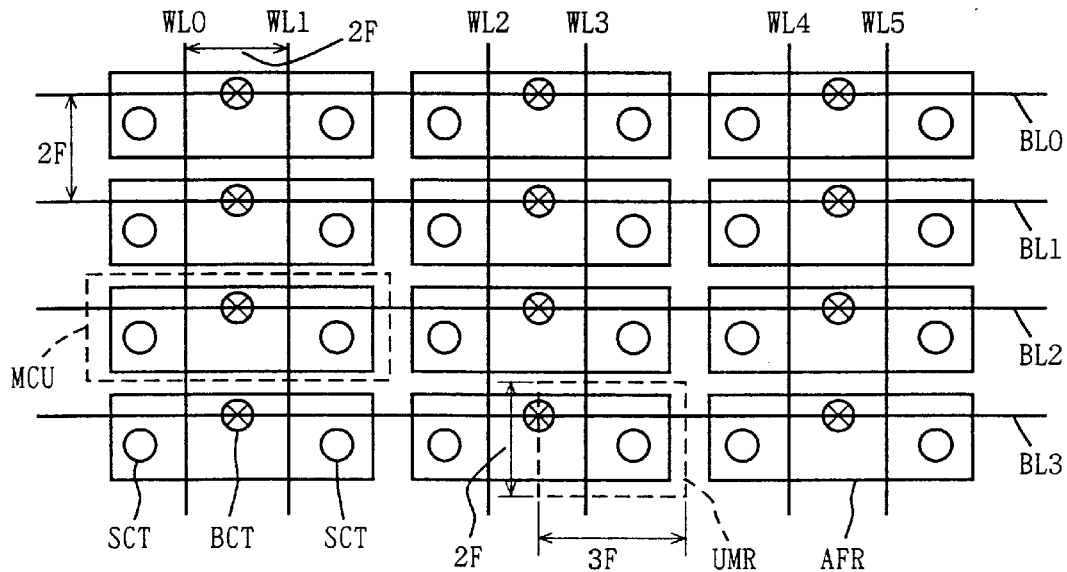
FIG. 42 schematically shows a conventional arrangement of NAND type cells.
Figure 43:
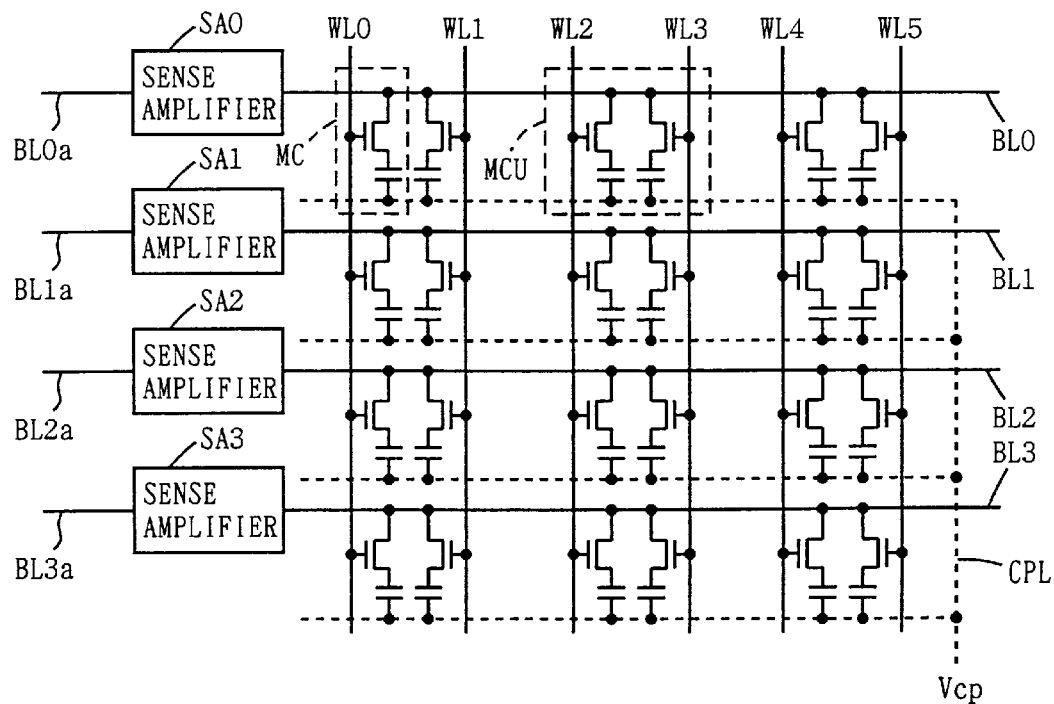
FIG. 43 shows an electrically equivalent circuit of the memory cell arrangement shown in FIG. 42.

Referring to FIG. 1, a memory cell minimum unit MCU includes two memory cells placed opposite to each other relative to a bit line contact BCT. In each of the two memory cells, an access transistor and a memory cell capacitor are interconnected via a storage node contact SCT. FIG. 1 shows an active region AFR of 2 bits of memory cells. Thus, the structures of memory cell minimum unit MCU and active region AFR are the same as those shown in FIG. 42. However, according to the arrangement illustrated in FIG. 1, bit line contacts BCT are arranged periodically in a row direction and shiftedly in a column direction. In the row direction, bit line contacts BCT are placed at the same position with three bit lines being a unit. In the column direction, bit line contacts BCT are arranged every three word lines. Between memory cell minimum units MCU adjacent to each other in the column direction, one word line is provided.

In the arrangement of memory cells illustrated in FIG. 1, memory cells are periodically arranged in the row and the column directions with a set of three word lines and a set of three bit lines each being a unit. Two memory cells are provided per three word lines, and two memory cells are provided per three bit lines. A memory cell occupation region per one bit (memory cell unit region) UMR has a pitch of 2·F in the row direction, and 3·F in the column direction, and accordingly an occupation area of memory cell unit region UMR is 6·F2, to achieve a memory cell occupation area per one bit equal to that in the memory cell arrangement shown in FIG. 42.

Figure 2:
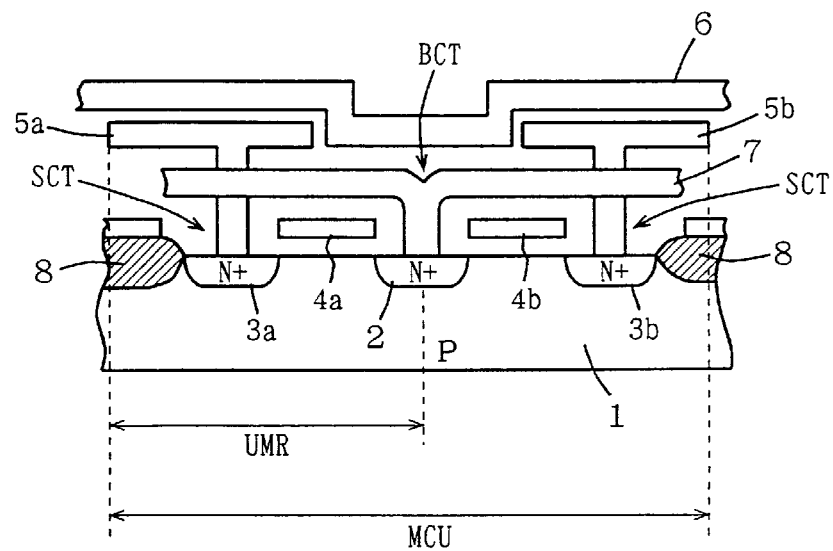
FIG. 2 schematically shows a cross sectional structure of a memory cell minimum unit shown in FIG. 1.

FIG. 2 schematically shows a cross sectional structure of 2 bit memory cells of memory cell minimum unit MCU shown in FIG. 1. Referring to FIG. 2, memory cell minimum unit MCU includes high-concentration N type impurity regions 2, 3a and 3b formed spacedly from each other at a surface of a P type semiconductor substrate region 1. A gate electrode layer 4a is formed above a channel region between impurity regions 2 and 3a on a gate insulating film (not shown), and a gate electrode layer 4b is formed above a channel region between impurity regions 2 and 3b on a gate insulating film (not shown). Gate electrode layers 4a and 4b respectively correspond to word lines.

Memory cell minimum unit MCU further includes an electrode layer 5a connected to impurity region 3a via storage node contact SCT, an electrode layer 5b connected to impurity region 3b via storage node contact SCT, and an electrode layer 6 formed above electrode layers 5a and 5b on a capacitor insulating film (not shown). Electrode layers 5a and 5b each form one electrode (storage node) of the capacitor of the memory cell, and electrode layer 6 forms a cell plate electrode of the other electrode of the capacitor. In the first embodiment, the voltage of cell plate electrode layer 6 can be controlled individually in each column. A capacitor of one memory cell is formed of a region between electrode layer 5a and cell plate electrode layer 6, and a capacitor of the other memory cell is formed of a region between electrode layer 5b and cell plate electrode layer 6.

Impurity region 2 is connected via bit line contact BCT to a conductive layer 7 which in turn forms a bit line arranged to extend in the column direction. One memory cell is constituted of impurity regions 2 and 3a, gate electrode layer 4a and electrode layer 5a, and the other memory cell is constituted of impurity regions 2 and 3b, gate electrode layer 4b and electrode layer 5b. Cell plate electrode layer 6 is provided commonly to these memory cells. Storage node electrode layer 5a is arranged to extend above and to an adjacent word line. An active region of these memory cells is surrounded by a thick cell isolation insulating film 8. An adjacent word line is provided on cell isolation insulating film 8.

Figure 3:
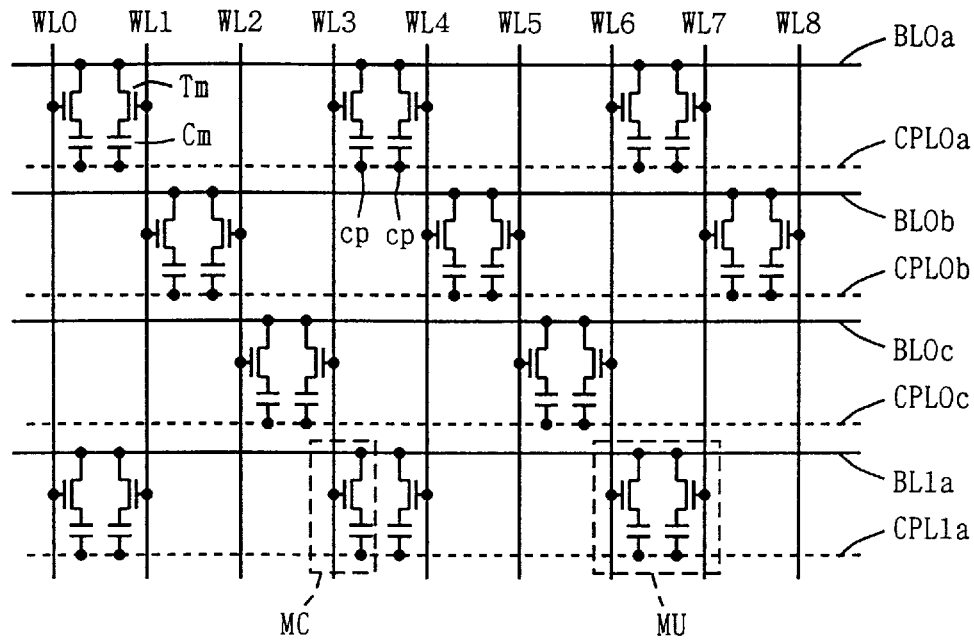
FIG. 3 shows an electrically equivalent circuit of the memory cell arrangement shown in FIG. 1.

FIG. 3 shows a circuit electrically equivalent to the memory cell arrangement shown in FIG. 1. Referring to FIG. 3, memory cells are arranged such that 2 bits of memory cells MU as a unit are arranged repeatedly every three bit lines in the row direction, and every three word lines in the column direction. Memory cell positions are different between adjacent bit lines and between adjacent word lines.

As shown in FIG. 3, regarding one bit line, two memory cells (one memory cell unit MU) are provided per three word lines, and regarding one word line, two memory cells are provided per three bit lines. A sense amplifier is provided to a set of the three bit lines. For one set of bit lines, when one word line is selected, 2 bits memory cells are simultaneously selected. Reading of memory cell data onto one bit line is inhibited, sensing operation is carried out using one of the remaining two bit lines as a read bit line and the other bit line which is not connected a memory cell as a reference bit line, to achieve the folded bit line configuration. In order to inhibit reading of data of the selected memory cell, a cell plate line connected to cell plate nodes CP is separated for each respective column (each bit line). Cell plate lines CPL0a–CPL1a are provided corresponding to respective bit lines BL0a–BL1a to control the voltage level thereof.

For example, when one word line WL1 is selected, memory cell data are read onto bit lines BL0a and BL0b while bit line BL0c keeps a precharge voltage level. While reading of memory cell data onto one of bit lines BL0a and BL0b is inhibited, the sensing operation is performed using the voltage of bit line BL0c as a reference voltage and one of bit lines BL0a and BL0b as a read bit line. Accordingly, data reading is done with a high noise immunity without destruction of data of a non-selected memory cell.

Although not clearly shown in FIG. 3, when word line WL0 is selected, memory cell data are respectively read onto bit lines BL0a and BL0c since a memory cell is also arranged corresponding to a crossing of word line WL0 and bit line BL0c. As a method of inhibiting reading of data of a selected memory cell, the principle of the method is described in "1995 Symposium VLSI Circuits Digest of Technical Papers, pages 79 to 80".

Figure 4:
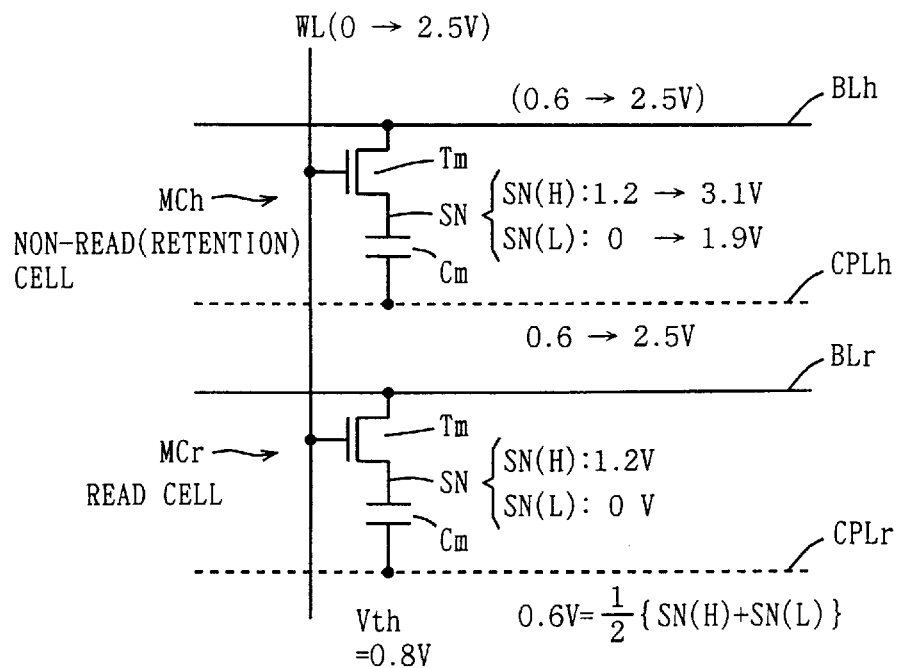
FIG. 4 schematically shows a manner of voltage application to cell plate lines for a read bit line and a data retention bit line in the first embodiment of the invention.

FIG. 4 schematically shows a structure for inhibiting reading of data of a memory cell connected to a selected word line illustrated in the above document. FIG. 4 representatively shows two bit lines BLh and BLr, one word line WL, and memory cells MCh and MCr arranged corresponding to crossings of bit lines BLh and BLr and word line WL. When word line WL is selected, data of memory cell MCr is read and reading of data of memory cell MCh is inhibited. A cell plate line CPLh is provided to memory cell MCh connected to bit line BLh, and a cell plate line CPLr is provided to memory cell MCr connected to bit line BLr. The voltage levels of cell plate lines CPLh and CPLr can be set independently of each other. In the following description, threshold voltage Vth of access transistors of memory cells MCh and MCr is supposed to be 0.8V.

Suppose that the precharge voltage of cell plate lines CPLh and CPLr and bit lines BLh and BLr is at an intermediate voltage level of 0.6V for example. Now, a brief description of the operation is given below.

When an address signal is supplied, memory cell MCr is determined to have the data read therefrom among memory cells connected to word line WL in accordance with a column address signal. For the read memory cell MCr, bit line BLr and cell plate line CPLr maintain the intermediate voltage level. As to the voltage level of storage node SN, voltage SN (H) when H level data is stored is 1.2V, and voltage SN (L) when L level data is stored is 0V.

For non-read (retention) cell MCh, the voltage of bit line BLh and cell plate line CPLh both is raised from the precharge voltage of the intermediate level to the voltage of 2.5V equal to the voltage transmitted onto the word line. Word line WL is still at the level of 0V in a non-selected state. In non-read (retention) cell MCh, the voltage level of storage node SN increases according to increase of the voltage of cell plate line CPLh due to capacitive coupling of memory cell capacitor Cm. In FIG. 4, a coupling factor k of memory cell capacitor Cm is shown as 1, and voltage change (1.9V) of boosted voltage of cell plate line CPLh is shown to be transmitted to storage node SN. Consequently, when H level data is stored in storage node SN, the voltage level of storage node SN is 3.1V, while the voltage level of storage node SN is 1.9V when L level data is stored.

For read cell MCr, cell plate line CPLr maintains the intermediate voltage 0.6V. Bit line BLr also maintains the precharge voltage. Before word line selection operation, bit line BLr is set in an electrically floating state. In this state, word line WL is selected and the voltage level thereof increases from 0V to 2.5V. In memory cell MCh, the sum of source or drain voltage of access transistor Tm and threshold voltage Vth is greater than voltage 2.5V on the word line, and access transistor Tm of memory cell MCh keeps OFF state. In memory cell MCr, the voltage level of bit line BLr is the precharge voltage level of 0.6V, and the voltage level of storage node SN is at most 1.2V. Accordingly, in memory cell MCr, access transistor Tm is in ON state, charges accumulated in storage node SN flow to bit line BLr, resulting in change of the voltage level of storage node SN.

According to the voltage control of the prior art, data can be read from only one of a plurality of memory cells connected to a selected word line onto a corresponding bit line in accordance with column address signal, and reading of data from remaining memory cells can be inhibited. The prior art differentially amplifies the voltage of bit line BLr and cell plate line CPLr and uses cell plate line CPLr as a reference potential line. In the sensing operation, cell plate line CPLr is set in the electrically floating state.

In the structure shown in FIG. 4, data is read from one of the memory cells connected to one word line, and data is inhibited from being read from remaining memory cells. Provision of sense amplifiers to respective bit lines is required, to cause the severe condition of the sense amplifiers. According to the present invention, utilizing the structure that inhibits reading of data from a first memory cell connected to a selected word line shown in FIG. 4, sensing operation is carried out using a read bit line and a reference bit line, and a pitch condition of the sense amplifier is relaxed.

Specifically, cell plate voltage is controlled independently for each bit line by dividing a cell plate line of memory cells every bit line. Voltages of a cell plate line and a bit line connected to a memory cell having data to be inhibited from being read are increased to a prescribed voltage (memory cell data retention voltage Vintact) to prevent destruction of data and to form a read bit line and a reference bit line. Consequently, the folded bit line configuration is achieved to relax the pitch condition of the sense amplifiers.

Figure 5:
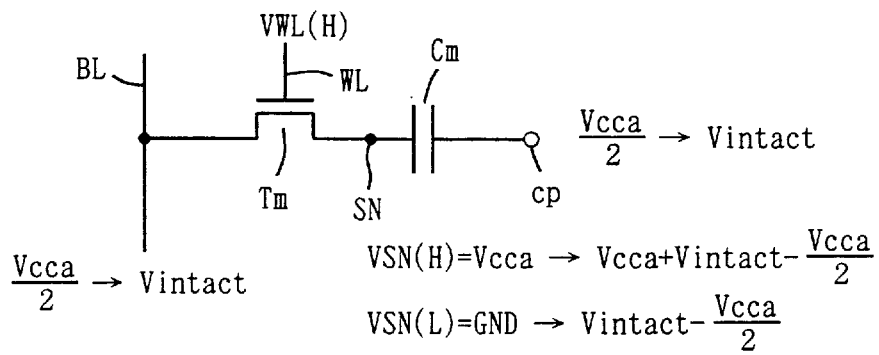
FIG. 5 shows a change sequence of voltage of each node of a memory cell connected to the data retention bit line when a word line selected.

FIG. 5 shows the condition of voltage application to a non-read (read inhibition) cell according to the first embodiment of the invention. The voltage of bit line BL increases from precharge voltage Vcca/2 to memory cell data retention voltage Vintact. The voltage of cell plate node CP changes from intermediate voltage Vcca/2 to memory cell data retention voltage Vintact. When selected, word line WL has voltage thereof raised to voltage VWL (H). Storage node SN has voltage VSN (H) at Vcca level when H level data is stored and has VSN (L) at GND (or) level when L level data is retained.

In this state, a condition for maintaining OFF state of access transistor Tm is derived from the following relations.

$$VWL(H)-Vth>VSN(L)+Vintact-Vcca/2$$

$$VWL(H)+Vcca/2-Vth>Vintact$$

Here, the level of voltage VSN (L) of the storage node retaining L level data equals to ground voltage (0V). In the relations above, coupling factor k of memory cell capacitor Cm is 1.

Access transistor Tm of the memory cell maintains OFF state and reading of data thereof onto bit line BL is inhibited even if word line WL is selected, by setting the voltage level of cell plate node CP and bit line BL to memory cell data retention voltage Vintact satisfying the relations above. Accordingly, destruction of data stored in storage node SN is prevented when word line WL is selected. Two memory cells are connected per three bit lines, a bit line connected to no memory cell is used as a reference bit line and memory cell data is read onto only one of the remaining bit lines connected to two memory cells. Consequently, sensing operation can be carried out with the folded bit line configuration.

Figure 6:
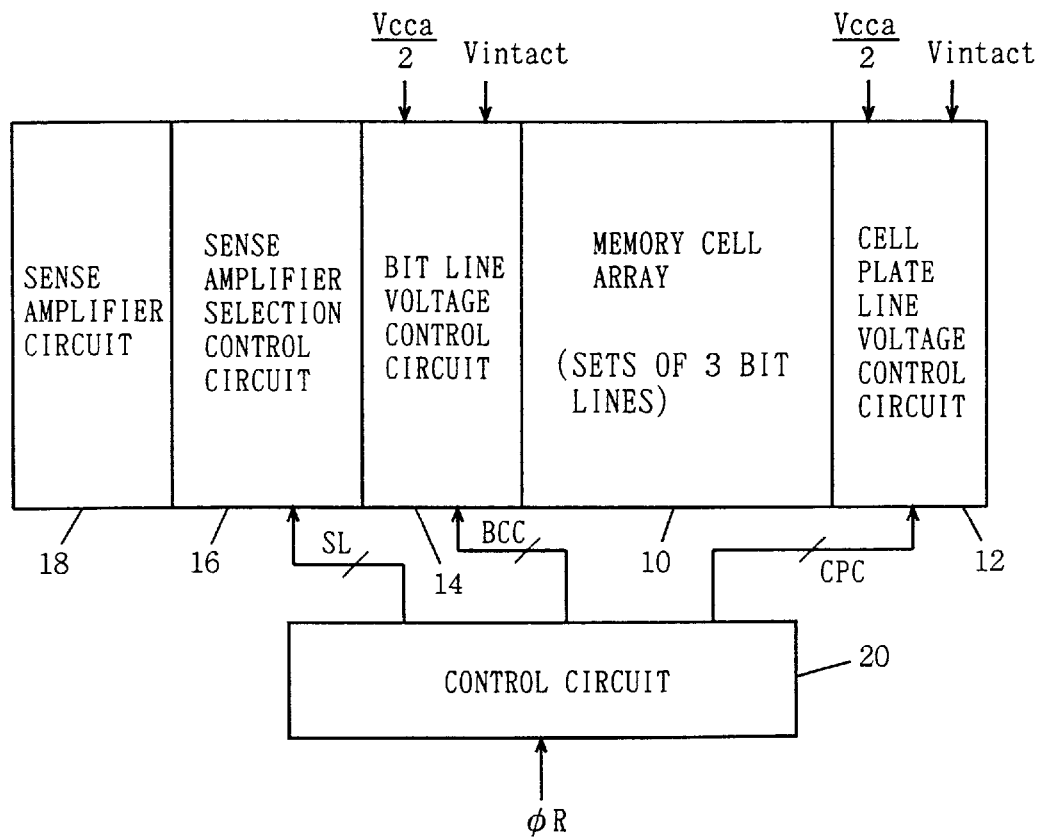
FIG. 6 schematically shows a structure of a main portion of the semiconductor memory device according to the first embodiment of the invention.

FIG. 6 schematically shows a structure of a main portion of the semiconductor memory device according to the first embodiment of the invention. Referring to FIG. 6, the semiconductor memory device includes a memory cell array 10 having a plurality of memory cells arranged in rows and columns, a cell plate line voltage control circuit 12 for controlling voltage of cell plate lines provided corresponding to respective bit lines included in memory cell array 10, a bit line voltage control circuit 14 for controlling voltage of respective bit lines included in memory cell array 10, a sense amplifier selection control circuit 16 for selecting two bit lines (read bit line and reference bit line) among a set of three bit lines included in memory cell array 10, and a sense amplifier circuit 18 including a plurality of sense amplifiers placed corresponding to respective sets each of three bit lines included in memory cell array 10 for differentially amplifying the potential of two of the three bit lines selected by sense amplifier selection control circuit 16.

Cell plate line voltage control circuit 12 sets the voltage of the cell plate line provided corresponding to each bit line to one of intermediate voltage Vcca/2 and memory cell data retention voltage Vintact, according to a control signal CPC supplied from control circuit 20. Bit line voltage control circuit 14 transmits the precharge voltage level equal to intermediate voltage Vcca/2 or memory cell data retention voltage Vintact to each bit line in accordance with a control signal BCC from control circuit 20. Sense amplifier selection control circuit 16 selects two of the three bit lines, according to a control signal SL from control circuit 20. Control circuit 20 generates control signals CPC, BCC and SL in accordance with a row designation signal (address signal or row decode signal).

In the structure shown in FIG. 6, cell plate voltage control circuit 12 transmits memory cell data retention voltage Vintact to a cell plate line connected to a non-read (retention) cell, and transmits intermediate voltage Vcca/2 to the other cell plate lines. Bit line voltage control circuit 14 maintains the voltage of each bit line at the voltage level of intermediate voltage Vcca/2 in a standby cycle, and transmits memory cell data retention voltage Vintact to a bit line connected to a non-read (retention) cell before the row selecting operation in an active cycle. Sense amplifier selection control circuit 16 selects a bit line onto which memory cell data is read, from two bit lines connected to memory cells connected to a selected word line, and selects the other bit line not connected to a memory cell to connect selected ones to corresponding sense amplifier.

Figure 7:
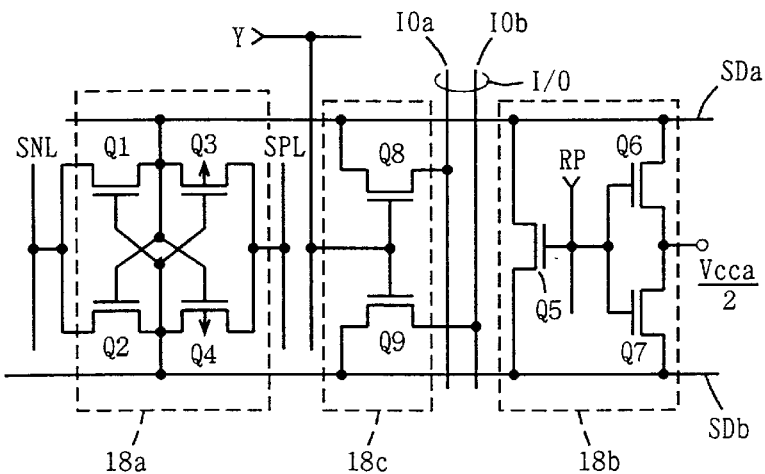
FIG. 7 shows a structure of a sense amplifier portion included in a sense amplifier circuit shown in FIG. 6.

FIG. 7 shows a structure of a sense amplifier included in sense amplifier circuit 18 illustrated in FIG. 6. FIG. 7 representatively shows a sense amplifier portion provided to one set of (three) bit lines. Referring to FIG. 7, the sense amplifier portion includes a CMOS sense amplifier 18a activating response to activation of sense amplifier activation signals SNL and SPL, to differentially amplify voltage on sense nodes SDa and SDb, a precharge/equalize circuit 18b activated, in response to activation of a precharge instruction signal RP, to precharge and equalize sense nodes SDa and SDb to the voltage level of intermediate voltage Vcca/2, and a column selection gate 18c responsive to a column selection signal Y supplied from a column decoder (not shown) to connect sense nodes SDa and SDb to bus lines included in an internal data bus I/O.

CMOS sense amplifier 18a includes cross-coupled n channel MOS transistors Q1 and Q2 responsive to activation of sense amplifier activation signal SNL to drive a sense node at a lower potential of sense nodes SDa and SDb to the ground voltage level, and cross-coupled p channel MOS transistors Q3 and Q4 responsive to activation of sense amplifier activation signal SPL to drive a sense node at a higher potential of sense nodes SDa and SDb to the supply voltage level. MOS transistors Q1–Q4 each have its source receiving sense amplifier activation signal SNL or SPL, and have its drain connected to a corresponding sense node SDa or SDb.

Precharge/equalize circuit 18b includes an n channel MOS transistor Q5 responsive to activation of precharge instruction signal RP to electrically short-circuit sense nodes SDa and SDb, and n channel MOS transistors Q6 and Q7 responsive to activation of precharge/equalize instruction signal RP to transmit intermediate voltage Vcca/2 to each of sense nodes SDa and SDb.

Column selection gate 18c includes n channel MOS transistors Q8 and Q9 responsive to column selection signal Y to connect sense nodes SDa and SDb respectively to bus lines IOa and IOb of internal data bus I/O.

The sense amplifier portion shown in FIG. 7 is provided corresponding to each set of bit lines. Sense nodes SDa and SDb are selectively connected to bit lines included in memory cell-array 10 by sense amplifier selection control circuit 16 shown in FIG. 6.

Figure 8:
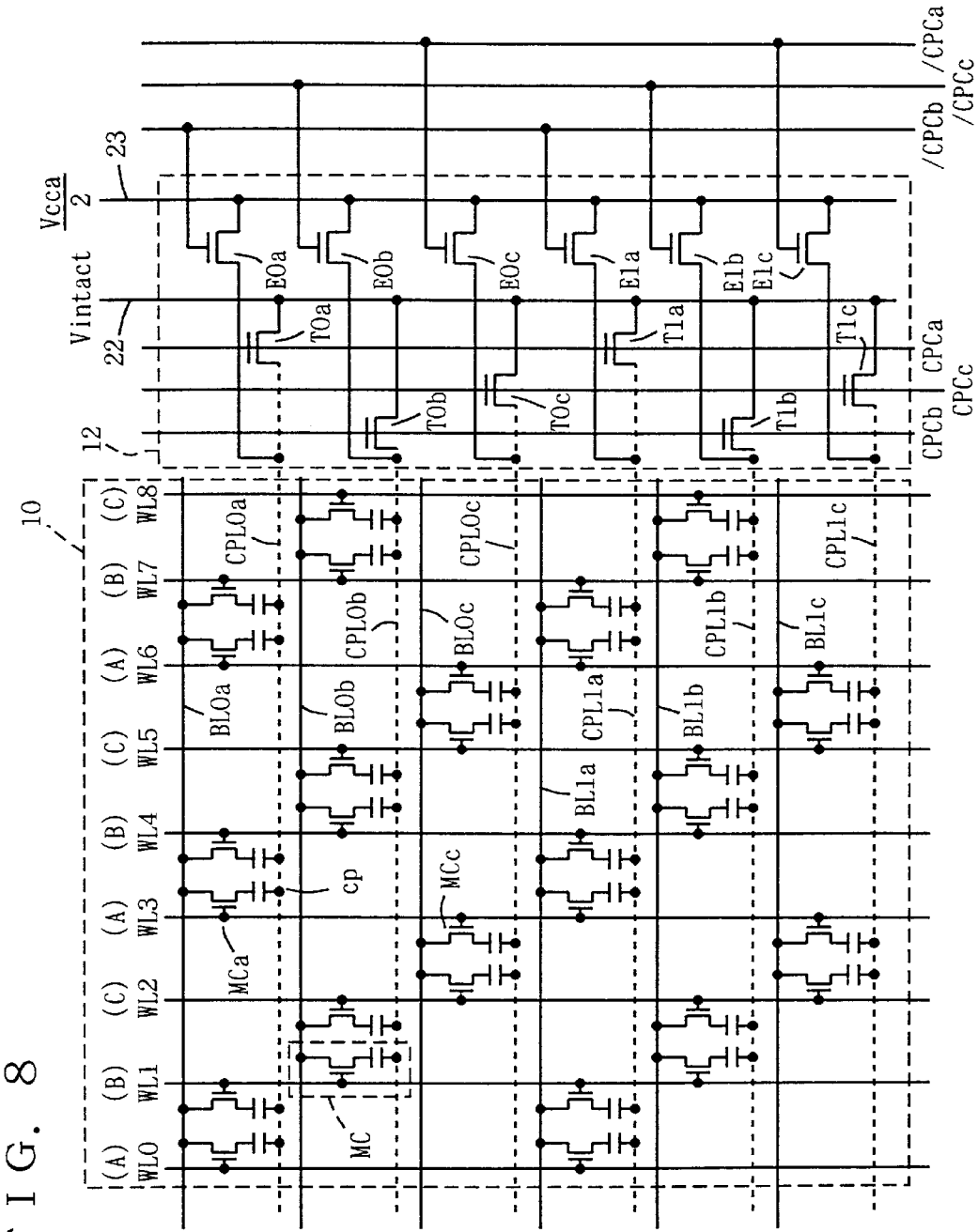
FIG. 8 shows configurations of a memory cell array and a cell plate line voltage control circuit shown in FIG. 6.

FIG. 8 shows one example of a configuration of cell plate line voltage control circuit 12 shown in FIG. 6. FIG. 8 further shows the configuration of memory cell array 10. Referring to FIG. 8, memory cell array 10 includes nine word lines WL0–WL8, and six bit lines BL0a–BL0c and BL1a–BL1c. In the row and column directions, memory cells MC are arranged every three word lines and every three bit lines, following the same pattern. Specifically, word lines and bit lines are respectively divided into three groups A, B and C. The arrangement of the memory cells is the same as that shown in FIG. 3.

Cell plate lines CPL0a–CPL0c and CPL1a–CPL1c are provided corresponding to respective bit lines BL0a–BL0c and BL1a–BL1c. Each of cell plate lines CPL0a–CPL1c is connected commonly to cell plate nodes CP of memory cells MC connected to a corresponding bit line.

Cell plate line voltage control circuit 12 includes n channel MOS transistors T0a and T1a provided corresponding to respective cell plate lines CPL0a and CPL1a and made conductive, in response to a cell plate voltage control signal CPCa, to connect corresponding cell plate lines CPL0a and CPL1a to a memory cell data retention voltage transmission line 22, n channel MOS transistors T0b and T1b provided corresponding to cell plate lines CPL0b and CPL1b respectively and made conductive, in response to a cell plate voltage control signal CPCb to connect corresponding cell plate lines CPL0b and CPL1b to cell plate voltage transmission line 22, n channel MOS transistors T0c and T1c provided corresponding to respective cell plate lines CPL0c and CPL1c, and made conductive, in response to a cell plate voltage control signal CPCc to connect cell plate lines CPL0c and CPL1c to cell plate voltage transmission line 22, and n channel MOS transistors E0a–E1c provided corresponding to cell plate lines CPL0a–CPL1c respectively and responsive to complementary cell plate voltage control signals /CPCa–/CPCc to connect corresponding cell plate lines CPL0a–CPL1c selectively to an intermediate voltage transmission line 23. Memory cell data retention voltage Vintact is transmitted onto cell plate voltage transmission line 22, and intermediate voltage Vcca/2 is transmitted onto intermediate voltage transmission line 23.

In the arrangement shown in FIG. 8, if word line WL3 is selected for example, storage data of memory cells MCa and MCc could be transmitted to bit lines BL0a and BL0c. In this case, under control by control circuit 20 shown in FIG. 6, cell plate line CPL0c is connected to cell plate voltage transmission line 22, to set the voltage level of cell plate line CPL0c to memory cell data retention voltage Vintact, for example. Further, under control by the bit line voltage control circuit described below, the voltage level of bit line BL0c is maintained at the level of memory cell data retention voltage Vintact. Accordingly, reading of data from memory cell MCc is inhibited and memory cell MCc is kept in a data retention state. A-Cell plate line CPL0a is connected to intermediate voltage transmission line 23 by MOS transistor E0a in the conductive state in response to complementary cell plate voltage control signal /CPCa and maintained at the voltage level of intermediate voltage Vcca/2. Sensing operation for memory cell data by the sense amplifier is then performed using bit line BL0a as a read bit line and bit line BL0b connected to no memory cell as a reference bit line.

In the configuration of cell plate voltage control circuit 12 illustrated in FIG. 8, when a memory cell is selected (active cycle), a cell plate line corresponding to the read bit line is prevented from being set in the floating state using complemental cell plate voltage control signals /CPCa–/CPCc. Complemental cell plate voltage control signals /CPCa–/CPCc are generated as complementary signals from control circuit 20, and a p channel MOS transistor may be used as an MOS transistor for transmitting the intermediate voltage. An advantage obtained by utilizing the complementary control signals is described later in detail.

Figure 9:
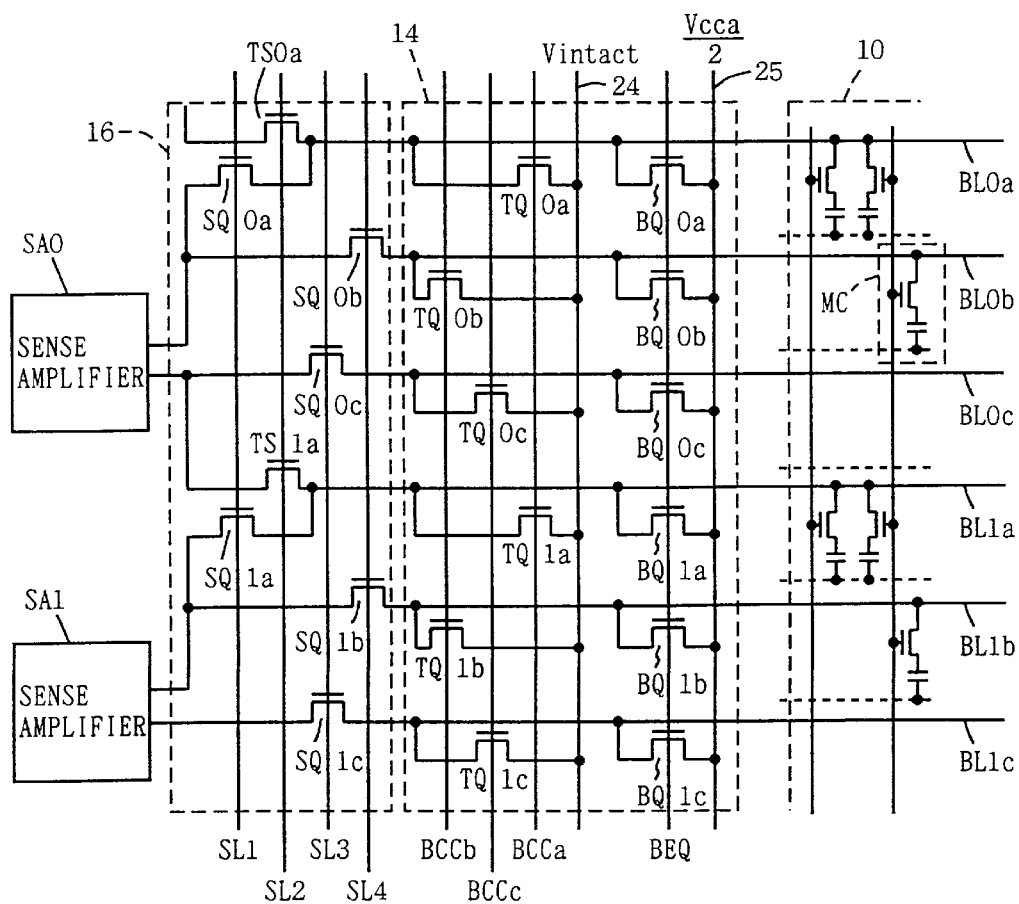
FIG. 9 shows configurations of the memory cell array, a bit line voltage control circuit, and a sense amplifier selection control circuit shown in FIG. 6.

FIG. 9 shows configurations of bit line voltage control circuit 14 and sense amplifier selection control circuit 16 illustrated in FIG. 6. FIG. 9 representatively shows a configuration corresponding to six bit lines BL0a–BL1c. Referring to FIG. 9, bit line voltage control circuit 14 includes n channel MOS transistors TQ0a and TQ1a provided corresponding to bit lines BL0a and BL1a and responsive to a bit line voltage control signal Vcca to connect bit lines BL0a and BL1a to a memory cell data retention voltage transmission line 24, n channel MOS transistors TQ0b and TQ1b responsive to a bit line voltage control signal BCCb to connect bit lines BL0b and BL1b to memory cell data retention voltage transmission line 24, n channel MOS transistors TQ0c and TQ1c made conductive, in response to bit line voltage control signal BCCc, to connect bit lines BL0c and BL1c respectively to memory cell data retention voltage transmission line 24, and n channel MOS transistors BQ0a–BQ1c responsive to a bit line equalize instruction signal BEQ to connect bit lines BL0a–BL1c respectively to a bit line precharge voltage transmission line 25.

Memory cell data retention voltage Vintact is transmitted onto memory cell data retention voltage transmission line 24, and intermediate voltage Vcca/2 is transmitted onto bit line precharge voltage transmission line 25. The configuration of bit line voltage control circuit 14 is the same as that of cell plate voltage control circuit 12 shown in FIG. 8. This is because when the voltage of a cell plate line is changed, the voltage of a bit line is also changed accordingly.

Sense amplifier selection control circuit 16 includes n channel MOS transistors SQ0a and SQ1a provided corresponding to bit lines BL0a and BL1a respectively and responsive to a selection control signal SL1 to connect bit lines BL0a and BL1a to one sense node (SDa or SDb) of sense amplifiers SA0 and SA1, n channel MOS transistors TS1a and TS0a responsive to a selection control signal SL2 to connect bit lines BL1a and BL0a to sense amplifier SA0 and to a sense amplifier (not shown) each adjacent to a corresponding sense amplifier, n channel MOS transistors SQ0c and SQ1c made conductive, in response to a selection control signal SL3, to connect bit lines BL0c and BL1c to the other sense node (SDb or SDa) of corresponding sense amplifiers SA0 and SA1, and n channel MOS transistors SQ0b and SQ1b responsive to a selection control signal SL4 to connect bit lines BL0b and BL1b to one sense node of corresponding sense amplifiers SA0 and SA1.

Sense amplifier selection control circuit 16 connects a read bit line and a reference bit line to a corresponding sense amplifier or an adjacent sense amplifier according to selection control signals SL1–SL4.

Figures 10, 11, 12:
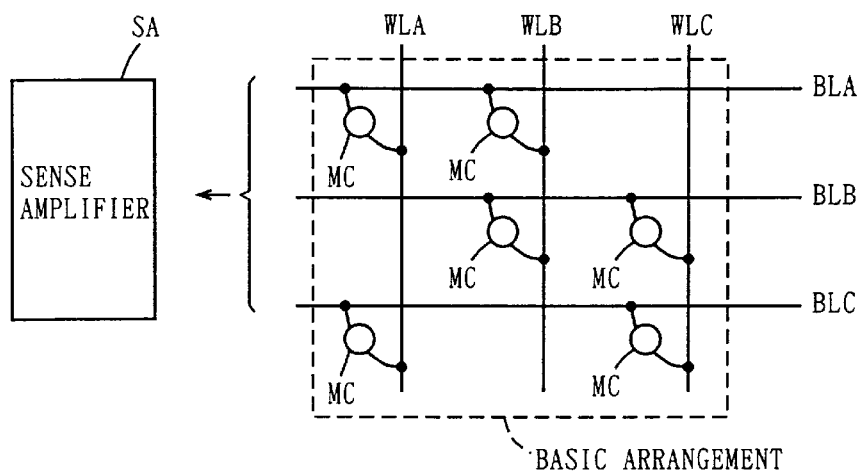
FIG. 10 shows a correlation between a selected word line and each control signal in the configuration shown in FIGS. 8 and 9.
FIG. 11 schematically shows a basic arrangement of the memory cell array shown in FIG. 8.
FIG. 12 shows in a table a correlation between a selected word line, a read bit line, a reference bit line and a data retention bit line in the memory cell arrangement shown in FIG. 11.

FIG. 10 shows in a table correspondence between a selected word line and a control signal to be activated in the memory cell array arrangement shown in FIGS. 8 and 9. "H" represents a state of being driven into an active state in FIG. 10. Remaining control signals are kept in an inactive state at an L level. Word line WLA represents word lines WL0, WL3 and WL6 included in group A shown in FIG. 8, and word line WLB represents word lines WL1, WL4 and WL7 included in group B of FIG. 8. Word line WLC represents word lines WL2, W5, and WL8 included in group C. When one word line WL (any of WLA, WLB and WLC) is selected, memory cells are connected to two bit lines among three bit lines in one set. For example, if word line WL3 of FIG. 8 is selected, memory cells MCa and MCc are connected to bit lines BL0a and BL0c. Depending on which of storage data of the memory cells MCa and MCc is to be read, control signals are generated differently.

If data of memory cell MCa is to be read for example, control signals CPCc and BCCc are set at H level, the voltage level of bit line BL0c and cell plate line CPL0c is maintained at the level of memory cell data retention voltage Vintact, so that reading of data of memory cell MCc is inhibited. In this case, bit line BL0b serves as a reference bit line in performing sensing operation using bit line BLa as a read bit line. However, bit lines BL0a and BL0b are connected to the same sense node of sense amplifier SA0 as shown in FIG. 9. Therefore, control signal SL2 is set at H level to connect bit line BL0a to an adjacent sense amplifier. In this case, sense amplifier SA0 amplifies memory cell data transmitted from bit line BL1a included in an adjacent set of bit lines. Sense amplifier SA1 differentially amplifies the voltage of corresponding bit line BL1b and a bit line (BL2a) included in an adjacent set of bit lines.

When data of memory cell MCc is to be read, control signals CPCa and BCCa are set at H level and the voltage of bit line BL0a and cell plate line CPL0a is set at the level of memory cell data retention voltage Vintact to inhibit reading of data from memory cell MCa. In this case, bit line BL0b is the reference bit line and the read bit line is bit line BL0c. Accordingly, control signals SL3 and SL4 are set at H level to connect bit lines BL0b and BL0c to sense amplifier SA0.

Similarly, when one word line is selected, memory cell data retention voltage Vintact is transmitted to one of memory cells connected to the selected word line, according to which of data of two memory cells is to be read. Data on a read bit line is amplified using a bit line which is not connected to a memory cell as a reference bit line.

FIG. 11 schematically shows a basic arrangement of a memory cell array. Referring to FIG. 11, memory cells MC are arranged at crossings of three word lines WLA–WLC and three bit lines BLA–BLC, following a memory cell arrangement patterns which are different in the row direction and in the column direction. In the row and column directions respectively, two memory cells are placed in the basic arrangement. The basic arrangement shown in FIG. 11 is repeatedly placed in the row and column directions. One sense amplifier SA is provided to three bit lines BLA–BLC.

FIG. 12 shows in a table the relation between selected word lines and attributes of respective bit lines in the basic arrangement shown in FIG. 11. When word line WLA is selected, the reference bit line is bit line BLB, one of bit lines BLA and BLC is the read bit line, and the other is a data retention bit line onto which reading of a memory cell data is inhibited. When word line WLB is selected, bit line BLC is the reference bit line, one of bit lines BLA and BLB is the read bit line, and the other is the data retention bit line. Bit lines BLA and BLB are coupled to the same sense node of the sense amplifier as shown in FIG. 9. In this case, bit line BLA is connected to an adjacent sense amplifier. When word line WLC is selected, the reference bit line is BLA, one of bit lines BLB and BLC is the read bit line, and the other is the data retention bit line. If bit line BLB is the read bit line and bit line BLA is the reference bit line, bit line BLA is also connected to an adjacent sense amplifier for preventing confliction of the sense node.

As shown in the table of FIG. 12, the data retention voltage can be transmitted to the cell plate line and the bit line and the bit lines can be connected to the sense amplifiers by specifying a selected word line and specifying which of the upper and lower bit lines is to be selected, to select one of two memory cells connected to the selected word line.

Figure 13:
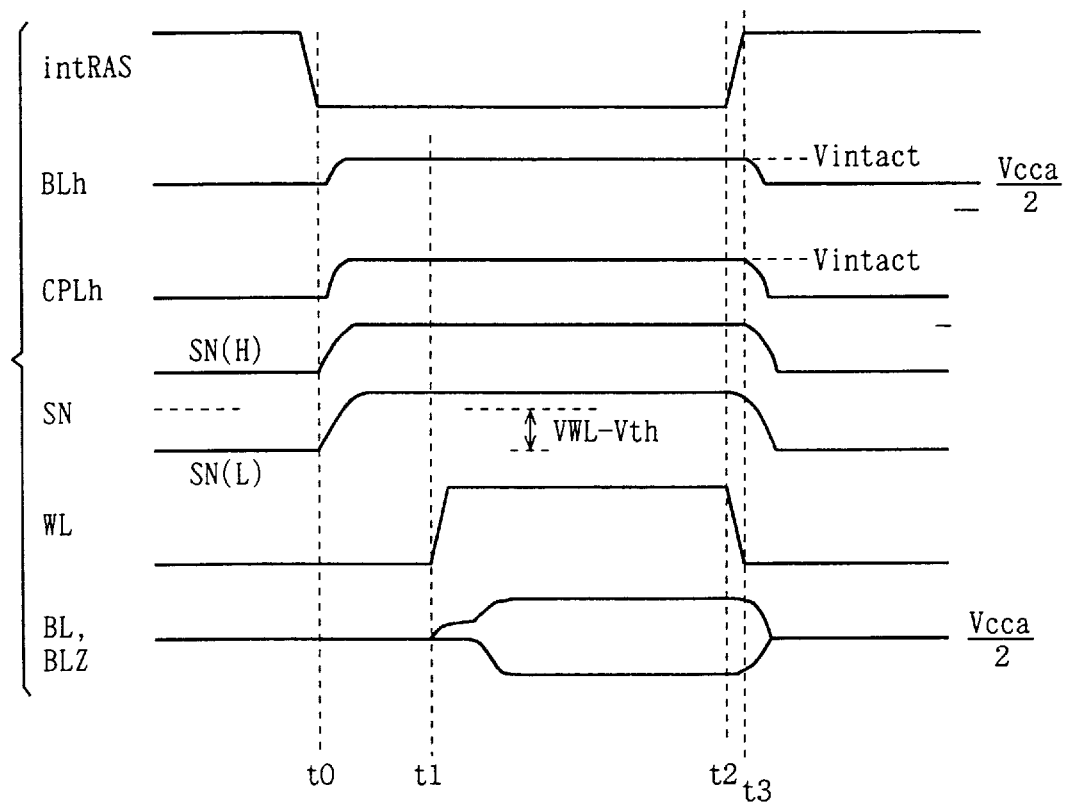
FIG. 13 shows signal waveforms representing data reading operation according to the first embodiment of the invention.

FIG. 13 shows signal waveforms when data is read in the semiconductor memory device according to the first embodiment of the invention. Referring to FIG. 13, an internal row address strobe signal intRAS is generated according to an external row address strobe signal ext/RAS, or activated according to an active command for externally instructing a row selection. In a synchronous semiconductor memory device (SDRAM), an operation mode is designated by a command.

A bit line BLh represents a data retention bit line, and a cell plate line CPLh represents a data retention cell plate line. A storage node SN represents a storage node of a data retention memory cell having data thereof inhibited from being read. Bit lines BL and BLZ respectively represents a read bit line and a reference bit line. Now, a brief description of an operation is given.

When a row selection instruction signal (the external row address strobe signal or the active command) is externally supplied, internal row address strobe signal intRAS is driven to an L level of an active state to start a memory cell row selection operation from time t0. According to activation of internal row address strobe signal intRAS at the time t0, a row address signal designating a row is defined. According to the defined row address signal, a word line to be selected is determined, and accordingly a read bit line, a reference bit line and a data retention bit line are determined. Based on this determination, the voltage level of data retention bit line BLh and data retention cell plate line CLh is driven from the level of intermediate voltage Vcca/2 to the level of memory cell data retention voltage Vintact. The voltages of other read bit line and reference bit line as well as corresponding cell plate lines are at the level of intermediate voltage Vcca/2 (Note that they are in the floating state). Following the increase of the voltage level of data retention cell plate line CPLh at the time t0, the voltage level of storage node SN of a corresponding memory cell increases. The storage node has L level voltage SN (L) which is at least at voltage VWL-Vth. Here, VWL represents the voltage level of the selected word line, and Vth represents the threshold voltage of the access transistor.

After the voltage levels of the data retention bit line BLh and data retention cell plate line CPLh are stabilized and accordingly the voltage level of storage node SN of the corresponding memory cell is stabilized, word line WL corresponding to the selected row is driven to a selected state. According to the voltage increase of word line WL, memory cell data is read onto read bit line BL and the voltage level thereof changes from precharge voltage Vcca/2. FIG. 13 representatively shows signal waveforms when data of an H level is read onto read bit line BL. Reference bit line BLZ keeps the voltage level of precharge voltage Vcca/2. When the potential difference between read bit line BL and reference bit line BLZ becomes sufficiently large, the sense amplifier is activated to allow memory cell data to be sensed, amplified and latched. At time t0, when the voltage level of read bit line BLh and read cell plate line CPLh is set, the sense amplifier and the bit lines are simultaneously connected. Next, data is read or written to the read bit line connected to the sense amplifier.

After writing or reading of data is completed, at the time t2, internal row address strobe signal intRAS rises to the H level of an inactive state, and accordingly word line WL is driven to the ground voltage level of a non-selected state.

Next at time t3, the voltage level of data retention bit line BLh and data retention cell plate line CPLh returns to the voltage level of intermediate voltage Vcca/2, and other bit line and cell plate line are precharged to intermediate voltage Vcca/2. One memory cycle is thus completed.

Figure 14:
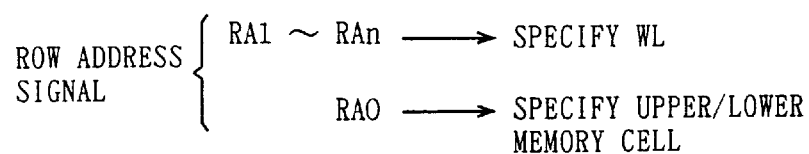
FIG. 14 illustrates how to generate a control signal is generated.

FIG. 14 shows a correspondence between row address signal bits and positions of the word line and memory cells. The row address signal includes bits RA0–RAn. Row address signal bits RA1–RAn specify a word line WL. The remaining bit RA0 (the least significant bit or the most significant bit) is used to specify one of two memory cells connected to the selected word line WL to be selected. For a set of three bit lines, there are two memory cells connected to one word line. Using the allocation of the address signal bits shown in FIG. 14, the voltage of the bit line and the cell plate line can be set and the bit lines and the sense amplifier can be connected according to the row address signal.

Figure 15:
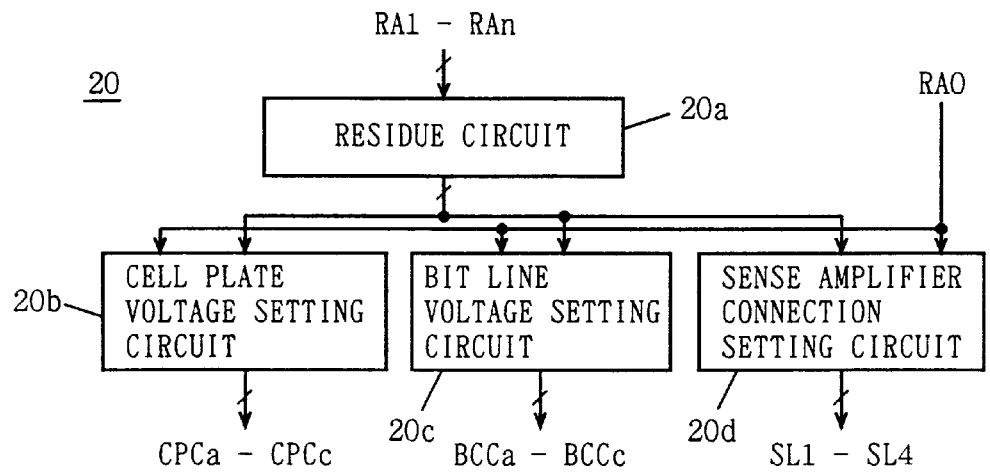
FIG. 15 schematically shows a structure of a control circuit according to the first embodiment of the invention.

FIG. 15 schematically shows a structure of control circuit 20 illustrated in FIG. 6. Referring to FIG. 15, control circuit 20 includes a residue circuit 20a dividing row address signal bits RA1–RAn as a binary number by 3 to determine the residue, a cell plate voltage setting circuit 20b generating cell plate voltage control signals CPCa–CPCc according to a residue indication signal from residue circuit 20a and row address signal bit RA0, a bit line voltage setting circuit 20c outputting bit line control signals BCCa–BCCc according to a signal output from residue circuit 20a and row address signal bit RA0, and a sense amplifier connection setting circuit 20d outputting sense amplifier connection control signals SL1–SL4 according to a signal output from residue circuit 20a and row address signal bit RA0.

Residue circuit 20a specifies one of word lines WLA, WLB and WLC to be selected by dividing the binary number of row address signal bits RA1–RAn by 3 and outputting the residue 0, 1 or 2. Cell plate voltage setting circuit 20b, bit line voltage setting circuit 20c and sense amplifier connection setting circuit 20d output, according to row address signal bit RA0, control signals CPCa–CPCc, BCCa–BCCc and SL1–SL4 respectively depending on which of the upper and lower memory cells connected to the selected word line is to be selected. By specifying a selected word line, and by specifying one of the two memory cells connected to the selected word line, the control signals can be driven selectively to the active state according to the table shown in FIG. 10. Voltage setting circuits 20b, 20c and 20d can be implemented using an ordinary logic circuit.

Figure 16:
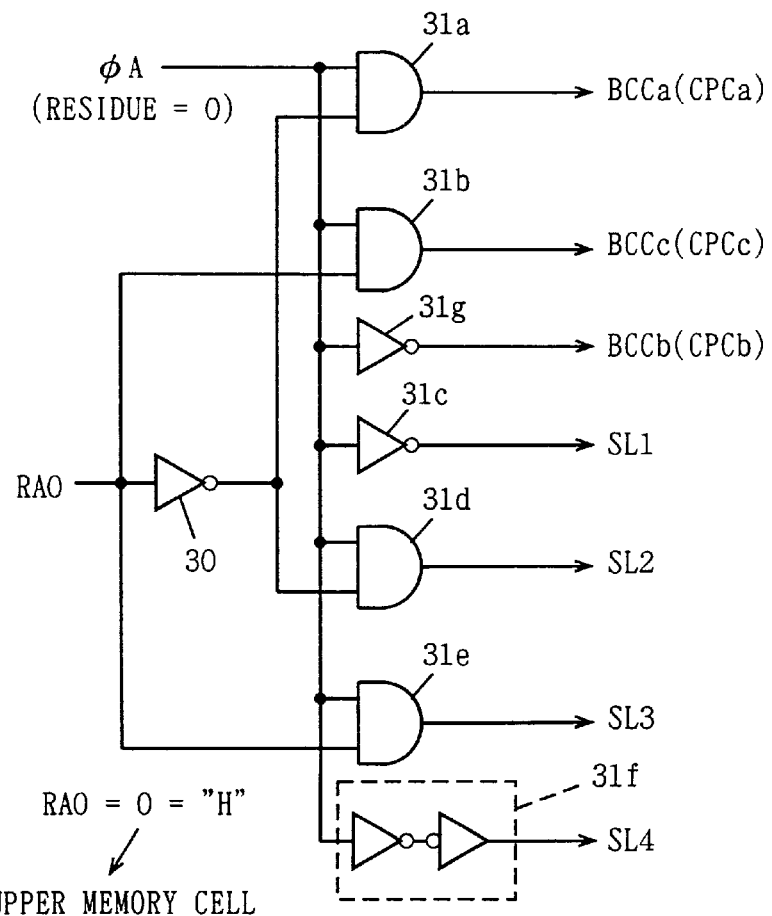
FIG. 16 shows one example of a structure of a cell plate voltage setting circuit, a bit line voltage setting circuit and a sense amplifier connection setting circuit shown in FIG. 15.

FIG. 16 schematically shows a structure of a control signal generating portion when word line WLA is selected. A word line group specification signal φA is activated when the residue determined by residue circuit 20a is 0, indicating that word line WLA is selected. Row address signal bit RA0 designates the upper one of the two memory cells when it is "0" (L) level. Control signals CPCa–CPCc and BCCa–BCCc are commonly illustrated in FIG. 16 since cell plate voltage setting circuit 20b and bit line voltage setting circuit 20c activate the control signals in the same manner.

Control signal BCCa (CPCa) is output from an AND circuit 31a receiving word line group specification signal φA and row address signal bit RA0 supplied via an inverter 30. Control signal BCCb (CPCb) is output from an inverter 31g receiving word line group specification signal φA. Control signal BCCc (CPCc) is output from an AND circuit 31b receiving word line group specification signal φA and row address signal bit RA0. Control signal SL1 is output from an inverter 31c receiving word line group specification signal φA. Control signal SL2 is output from an AND circuit 31d receiving word line group specification signal φA and row address signal bit RA0 supplied via inverter 30. Control signal SL3 is output from an AND circuit 31e receiving word line group specification signal φA and row address signal bit RA0. Control signal SL4 is output from a buffer circuit 31f receiving word line group specification signal A. When word line group specification signal φA is in the active state, control signals BCCb, CPCb and SL1 are maintained in the inactive state.

As illustrated clearly in the table shown in FIG. 10, when word line WLA is selected, control signal SL1 is in the state that corresponds to the inactive state. When word line WLA is selected, control signal SL4 is activated to be output according to word line group specification signal φA. Control signals BCCa (CPCa), BCCc (CPCc), SLC2 and SLC3 are selectively driven to the active state, depending on which of the upper and lower memory cells is designated by row address signal bit RA0. According to the structure shown in FIG. 16, the control signals can be generated in the manner shown in FIG. 10, and the correspondence between the selected word line, the read bit line, the reference bit line and the data retention bit line shown in FIG. 12 can be implemented. A similar circuit structure is applied to remaining word lines WLB and WLC. The final control signals (control signals supplied to the cell plate voltage control circuit, the bit line voltage control circuit and the sense amplifier selection control circuit) can be generated by employing ORing of control signals of different residues for each control signal. Residue circuit 20a is implemented using an ordinary division circuit.

[Control Circuit Structure 2]

Figure 17:
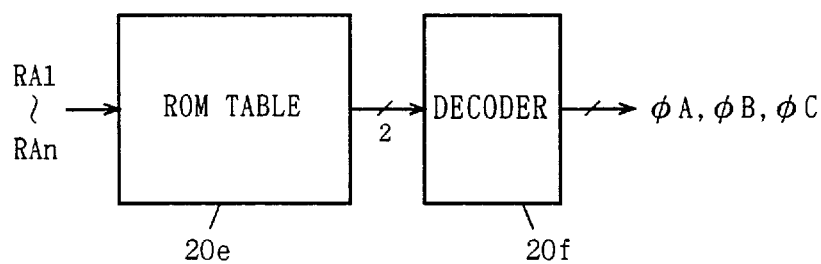
FIG. 17 schematically shows a second structure of the control circuit.

FIG. 17 schematically shows a second structure of control circuit 20 shown in FIG. 6. Referring to FIG. 17, control circuit 20 includes an ROM table 20e receiving row address signal bits RA1–RAn, and a decoder 20f decoding a signal output from ROM table 20e to activate any one of word line group specification signals φA, φB and φC. Signals output from decoder 20f are supplied to cell plate voltage setting circuit 20b, bit line voltage setting circuit 20c and sense amplifier connection setting circuit 20d illustrated in FIG. 15. In ROM table 20e, data that indicate which of word lines WLA, WLB and WLC is designated are stored in a table form correspondingly to row address signal bits RA1–RAn.

For example, when the number of word lines is 1024, and row address signal bits RA1–RAn are 10 bits, and ROM table 20e has a 1024·2-word configuration and stores information that specifies a corresponding word line group in each address. Word line group specification information of 2 bits supplied from ROM table 20e is decoded by the decoder 20f to activate any of word line group specification signals φA, φB and φC. The storage capacity of ROM table 20e is 2·1024 bits so that an occupation area thereof can be sufficiently decreased compared with residue circuit 20a shown in FIG. 15. Further, the correspondence between each row address and each respective word line is stored in the table form so that which is a selected word line among word lines WLA, WLB and WLC can be specified at a high speed.

When a ROM table is employed, the table shown in FIG. 10 may be stored in the ROM table. In this case, row address signal bits RA0–RAn are supplied to the ROM table, and each word includes bits representing the states of the respective control signals. Accordingly, a multi-bit word specifying which control signal is to be in the active state is output from the ROM table in accordance with row address signal bits RA0–RAn.

[Control Circuit Structure 3]

Figure 18:
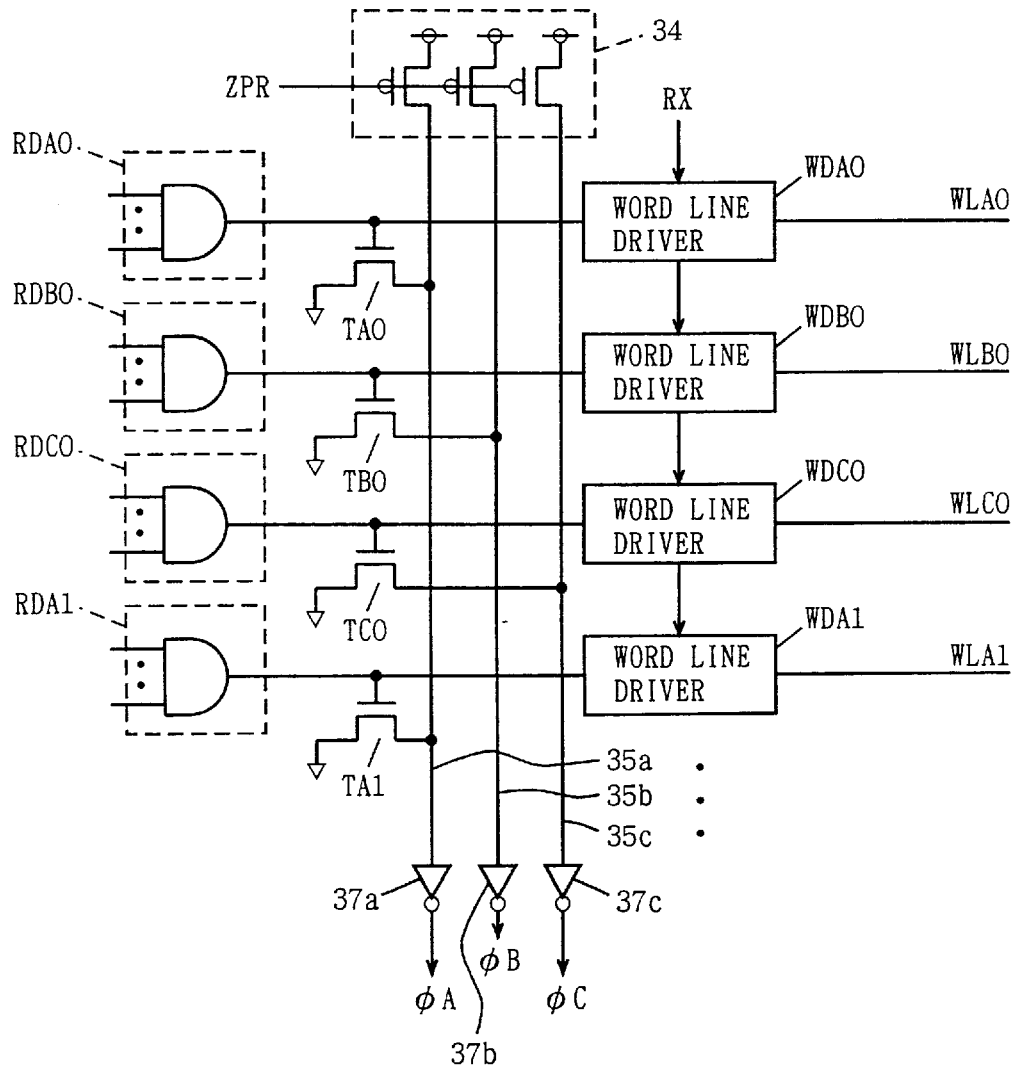
FIG. 18 schematically shows a third structure of the control circuit according to the first embodiment of the invention.

FIG. 18 schematically shows a third structure of the control circuit shown in FIG. 6. Referring to FIG. 18, word lines WLA0, WLB0, WLC0 and WLA1 are arranged. Word lines WLA0 and WLA1 are connected to memory cells in the same arrangement as that for word line WLA, and word lines WLB0 and WLC0 are connected to memory cells in the same arrangement as those for word lines WLB and WLC respectively. Provided to respective word lines WLA0–WLA1 are row decode circuits RDA0, RDB0, RDC0 and RDA1 decoding row address signal bits (not shown), and word line drivers WDA0, WDB0, WDC0 and WDA1 driving corresponding word lines in accordance with the signals output from corresponding row decode circuits when a word line activation signal RX is activated. Row decode circuits RDA0–RDA1 each have the structure of an AND type decode circuit, and output a signal of the H level when a corresponding word line is designated.

Control circuit 20 includes signal lines 35a, 35b and 35c provided corresponding to respective word lines WLA, WLB and WLC, and a precharge circuit 34 precharging signal lines 35a, 35b and 35c to the supply voltage level when precharge instruction signal ZPR is activated (L level). Signal lines 35a, 35b and 35c correspond respectively to word lines WLA, WLB and WLC of groups A, B and C. The control circuit further includes MOS transistors TA0, TB0, TC0 and TA1 provided respectively at outputs of row decoder circuits RDA0–RDA1 and become conductive, when the signals output from corresponding row decode circuits are in the selected state to discharge corresponding signal lines to the ground voltage level, and inverter circuits 37a, 37b and 37c inverting signal potential on signal lines 35a–35c to output word line group specification signals φA, φB and φC.

MOS transistors TA0, TA1 discharge signal lines provided corresponding to word line groups including respective corresponding word lines to the ground voltage level when selected. For example, when word line WLA0 is selected, an output signal from row decode circuit RDA0 attains the H level, MOS transistor TA0 becomes conductive, and signal line 35a is discharged to the ground voltage level. Inverter 37a inverts the signal potential on signal line 35a to set word line group specification signal φA into the active state of the H level. Remaining transistors TB0, TC0 and TA1 maintain OFF state since corresponding word lines WLB0, WLC0 and WLA1 are in the non-selected state and accordingly row decode circuits RDB0, RDC0 and RDA1 output signals at the L level. Accordingly, one of word lines WLA, WLB and WLC corresponding to the selected word line can be easily detected. A group of the selected word line (word lines WLA, WLB and WLC) is detected simply according to a word line driving signal output from the row decode circuit. Thus, a group of the selected word line can be speedily specified without increasing the circuit occupation area. Precharge circuit 34 precharges signal lines 35a, 35b and 35c to power supply voltage Vcc level in the standby cycle in accordance with precharge instruction signal ZPR, and precharge circuit 34 is in the inactive state in an access cycle to stop the precharge operation for signal lines 35a–35c.

Word line drivers WDA0–WDA1 drive a selected word line to the selected state in accordance with word line activation signal RX, after the states of word line group specification signals φA, φB and φC are defined and setting of the voltage level of each bit line and the cell plate line as well as connection between the sense amplifier and the bit lines are completed. Accordingly, referring to the signal waveforms shown in FIG. 13, word line activation signal RX is driven to the active state at time t1. Between time t0 and time t1 shown in FIG. 13, row decode circuits RDA0–RDA1 perform decoding operation to drive any of word line group specification signals φA–φC to the selected state, and setting of the bit line voltage and the cell plate voltage as well as connection between each sense amplifier and the bit lines are achieved.

Utilizing the structure illustrated in FIG. 18, the group of a selected word line can be specified speedily without using a complicate circuit structure, and accordingly the timing for word line activation can be advanced (since the word line group specification signal can be activated at a higher speed compared with the structure employing the division, and the word line group specification signal can be generated in parallel with decoding operation for word line selection).

According to the first embodiment of the present invention, memory cells are arranged such that two memory cells per three word lines and per three bit lines are periodically placed in the row and column directions respectively. Consequently, a memory cell occupation area of $6 \cdot F^2$ can be implemented to achieve a semiconductor memory device of high density and higher integration. Further, a data retention bit line is detected according to a selected word line and the voltage of the data retention bit line and a corresponding cell plate voltage are driven to the memory cell data retention voltage level in order to retain data of a non-selected memory cell. As a result, destruction of storage data in the non-selected memory cell can be prevented. Accordingly, "folded bit line configuration" is implemented to allow one sense amplifier per three bit lines to be arranged to relax the sense amplifier pitch condition.

(Second Embodiment)

Figure 19:
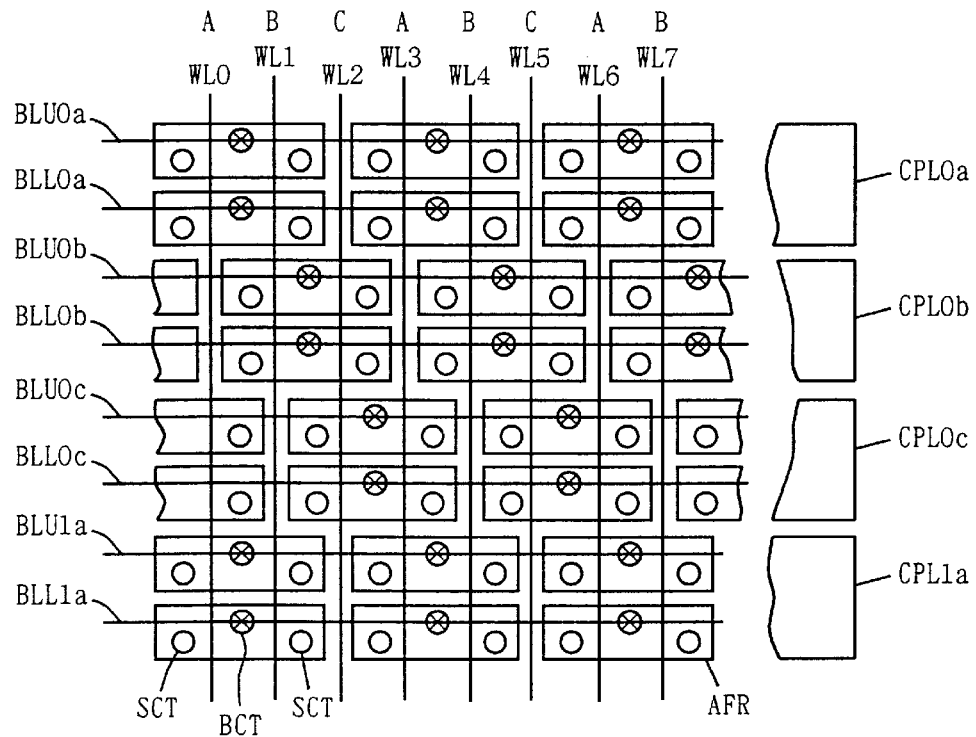
FIG. 19 schematically shows a memory cell arrangement of a semiconductor memory device according to a second embodiment of the invention.

FIG. 19 schematically shows a configuration of an array portion of a semiconductor memory device according to the second embodiment of the invention. Referring to FIG. 19, memory cells are arranged similarly for two bit lines adjacent to each other. Paired bit lines BLU0a and BLL0a are arranged and bit line contacts BCT are formed at the same position. Similarly, paired bit lines BLU0b and BLLb, paired bit lines BLU0c and BLL0c, and paired bit lines BLU1a and BLL1a are arranged. Bit lines BLU0a–BLU1a and bit lines BLL0a–BLL1a are alternately arranged. For the paired bit lines, bit line contacts are provided at the same position. Active regions AFR are periodically arranged in the row direction, while being shifted in the column direction by 1 pitch of the word line. A cell plate line is commonly provided to the paired bit lines. Specifically, a cell plate line CPL0a is placed for memory cells connected to bit line pair BLU0a and BLL0a, a cell plate line CPL0b is placed for memory cells connected to bit lines BLU0b and BLL0b, a cell plate line CPL0c is arranged for memory cells connected to bit lines BLU0c and BLL0c, and a cell plate line CPL1a is arranged for memory cells connected to bit lines BLU1a and BLL1a. The arrangement of word lines WL0–WL5 is the same as that of the first embodiment.

According to the array arrangement shown in FIG. 19, the pitch of cell plate lines CPL0a–CPL1a equals to the pitch of two bit lines. Compared with the case in which a cell plate line is individually provided to each bit line, the pitch condition of the cell plate lines is relaxed to allow the cell plate lines to be arranged with a sufficient margin. If the cell plate line is provided to each bit line, the width of the cell plate line is decreased and tolerance for mask alignment in the patterning is reduced. On the other hand, if one cell plate line is provided per two bit lines, the width of the cell plate line can be made sufficiently great and the interconnection resistance thereof can be decreased. Consequently, the cell plate voltage can be changed speedily, tolerance for mask misalignment can be enhanced, and the cell plate line can be easily patterned.

Figure 20:
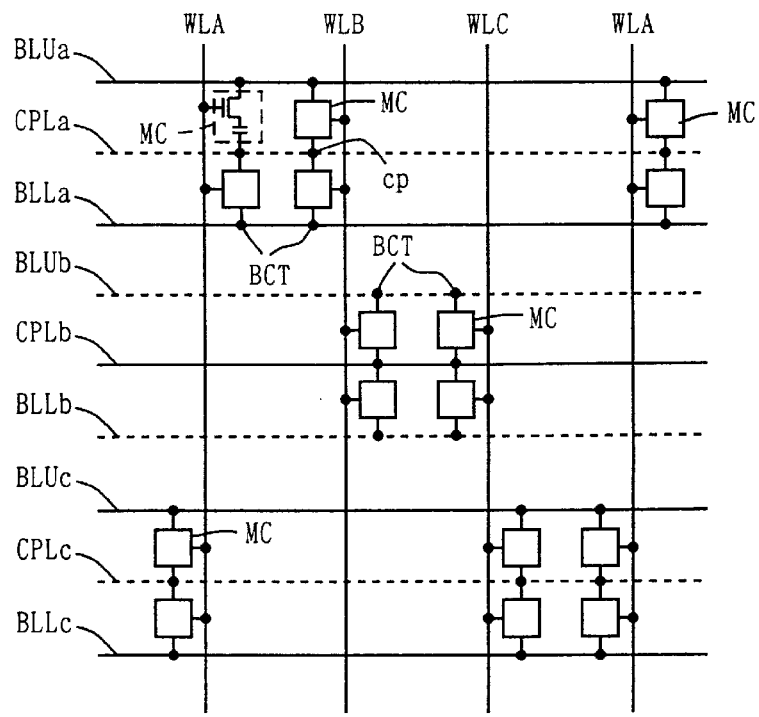
FIG. 20 schematically shows an electrically equivalent circuit of the memory cell arrangement shown in FIG. 19.

FIG. 20 illustrates a circuit electrically equivalent to the basic arrangement of memory cells shown in FIG. 19. FIG. 20 representatively shows word lines WLA, WLB and WLC, bit lines BLUa, BLLa, BLUb, BLLb, BLUc and BLLc, and cell plate lines CPLa, CPLb and CPLc. For bit lines BLUa and BLLa, memory cells MC are arranged at the same position, and connected to corresponding bit lines via bit line contacts BCT. Cell plate line CPL (CPLa–CPLc) is connected commonly to cell plate nodes CP of the capacitors of the memory cells arranged at the same position in two columns.

As shown in FIG. 20, in the row direction, memory cells are arranged with six bit lines as a unit. In the column direction, memory cells are arranged with three bit lines as a unit. One sense amplifier is provided to bit lines BLUa, BLUb and BLUc, and one sense amplifier is provided to bit lines BLLa, BLLb and BLLc. By arranging these sense amplifiers to be opposite to each other, the pitch condition of the sense amplifiers is made equal to the pitch of six bit lines. Consequently, the pitch condition of the sense amplifiers can be relaxed dramatically, and the layout of the sense amplifiers can be easily made.

Figure 21:
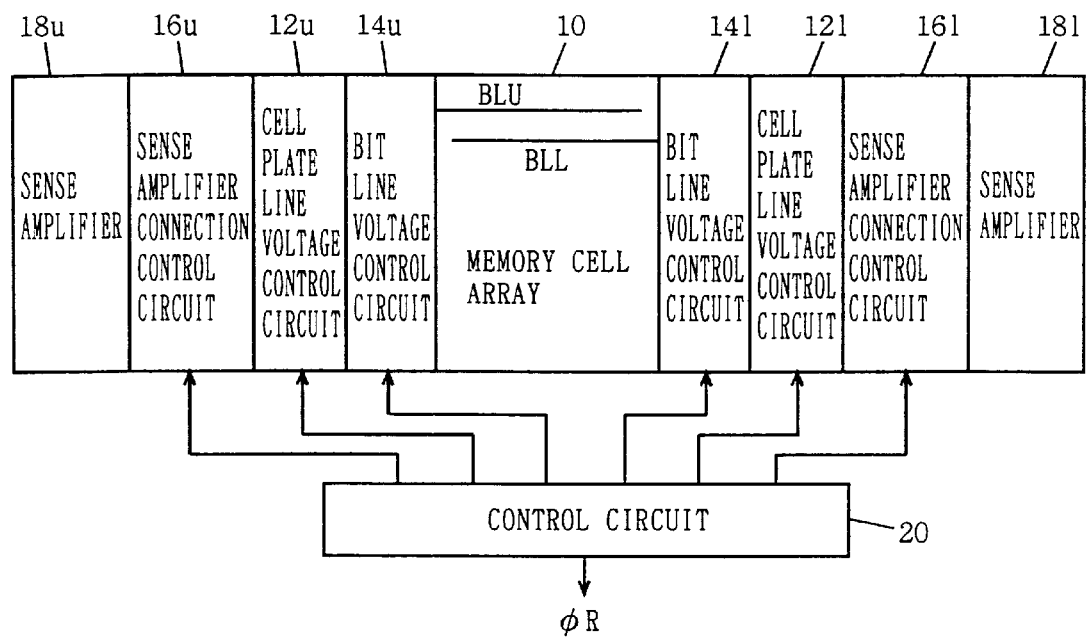
FIG. 21 schematically shows a structure of a main portion of the semiconductor memory device according to the second embodiment of the invention.

FIG. 21 schematically shows an entire structure of the semiconductor memory device according to the second embodiment of the invention. Referring to FIG. 21, bit lines BLU and BLL form a pair to be arranged in a memory cell array 10. Memory cells are arranged for bit lines BLU and BLL in the same manner. On one side of memory cell array 10, a bit line voltage control circuit 14u, a cell plate line voltage control circuit 12u, a sense amplifier connection control circuit 16u and a sense amplifier circuit 18u are provided to one of the paired bit lines (first bit line) BLU. On the other side of memory cell array 10, a bit line voltage control circuit 14l, a cell plate line voltage control circuit 12l, a sense amplifier connection control circuit 16l and a sense amplifier circuit 18l are provided to the other of the paired bit lines (second line) BLL. Bit line voltage control circuits 14u, 14l, cell plate line voltage control circuits 12u and 12l, sense amplifier connection control circuits 16l and 16u, and sense amplifier circuits 18u and 18l have the same structures as those shown in FIGS. 8 and 9.

The number of the gates (MOS transistor) of bit line voltage control circuits 14a and 14l, cell plate line voltage control circuits 12u and 12l, and sense amplifier connection control circuits 16u and 16l may be one per two bit lines so that the pitch condition of each gate can be relaxed. For three bit lines BLUa, BLUb and BLUc or BLLa, BLLb and BLLc, one of sense amplifier circuits 18u and 18l is provided. Accordingly, one of sense amplifier circuits 18u and 18l is provided to six bit lines, and layout of the sense amplifiers is easily implemented (since the pitch condition is relaxed). Control signals are supplied from control circuit 20 to control circuits 14u, 14l, 12u, 12l, 16u and 16l. The structure of control circuit 20 is the same as that of the first embodiment that supplies control signals to those control circuits placed on both sides of memory cell array 10 in the same manner. This is because when one word line is selected, a read bit line, a reference bit line and a data retention bit line are determined in the same manner for each of bit lines BLU and BLL.

Note that cell plate line voltage control circuits 12u and 12l are structured to control the voltage of the same cell plate line from both sides in the structure shown in FIG. 21. In this case, the voltage of the cell plate line having an increased width can be set at a desired voltage level Vintact at a high speed. Alternatively, cell plate line voltage control circuits 12w and 12l may have MOS transistors placed alternately on both sides of the memory array for each set of bit lines similarly to the sense amplifiers.

According to the second embodiment described above, the first bit line and the second bit line to which memory cells are similarly connected are alternately arranged, and the first bit line group and the second bit line group are respectively connected to control circuits and sense amplifiers placed on both sides of the memory cell array. Consequently, a cell plate line is commonly provided to paired first and second bit lines to relax the layout condition of the cell plate lines. Further, the pitch of the sense amplifiers can be set to the one corresponding to six bit lines to relax the pitch condition of the sense amplifiers.

(Third Embodiment)

Figure 22:
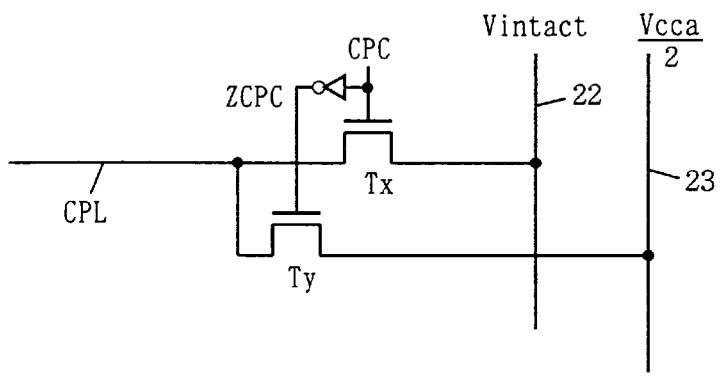
FIG. 22 schematically shows a structure of a main portion of a semiconductor memory device according to a third embodiment of the invention.

FIG. 22 schematically shows a structure of a main portion of a semiconductor memory device according to the third embodiment of the invention. FIG. 22 illustrates a structure of a portion corresponding to one cell plate line CPL. Referring to FIG. 22, similarly to the structure shown in FIG. 8, a cell plate line voltage control circuit includes a transfer gate Tx formed of an n channel MOS transistor for connecting cell plate line CPL to a memory cell data retention voltage transmission line 22 according to a cell plate voltage control signal CPC, and a transfer gate Ty formed of an n channel MOS transistor responsive to an inverted signal ZCPC of cell plate voltage control signal CPC to connect cell plate line CPC to an intermediate voltage transmission line 23. Only cell plate voltage control signal CPC is output from the control circuit, and complementary cell plate voltage control signal ZCPC is generated by the cell plate voltage control circuit.

According to the structure shown in FIG. 22, when memory cell selection operation is started, the voltage level of cell plate voltage control signal CPC is set at the H level or the L level according to a selected word line. When a bit line corresponding to cell plate line CPL is a reference bit line or a read bit line, the cell plate voltage control signal CPC is at the L level. At this time, cell plate voltage control signal ZCPC is at the H level, and cell plate line CPL is connected to intermediate voltage transmission line 23 via transfer gate Ty. Accordingly, cell plate line CPL is maintained at the voltage level of intermediate voltage Vcca/2 in the standby cycle and the active cycle, similarly to the structure shown in FIG. 8. When a bit line corresponding to cell plate line CPL is the memory cell data retention bit line, cell plate voltage control signal CPC is at the H level. In this case, cell plate line CPL is connected to memory cell data retention voltage transmission line 22.

Cell plate line CPL is selectively connected to intermediate voltage transmission line 23 and memory cell data retention voltage transmission line 22, similarly to the case in which complementary cell plate voltage control signals CPC and /CPC are used. Consequently, variation of the cell plate voltage for the reference bit line or the read bit line due to the capacitive coupling can be prevented when the voltage of the cell plate line corresponding to the data retention bit line changes, change of the state of a1a the access transistor from OFF to ON in a non-selected memory cell can be prevented, so that a data retention characteristics is improved. Particularly the charges flow out from the storage node of a non-selected memory cell (cell not to be selected) when the voltage of the cell plate line decreases due to the capacitive coupling, H level data could be destructed. (The disturb refresh characteristic deteriorates.) The deterioration of the disturb refresh characteristic can be prevented by fixing the cell plate line voltage at a constant voltage level. Transmission of complementary control signals over a long distance is unnecessary and power consumption can be decreased.

The reference bit line is set in the floating state in the active cycle in order to utilize a feature of the sense amplifier that cancels noises when common mode noises appear on the read bit line.

According to the third embodiment of the invention, the cell plate line is always set at a constant voltage level by generating a complementary cell plate voltage control signal, using the inverter. Therefore, it is possible to prevent potential change of a storage node of a non-selected memory cell due to the capacitive coupling or noises to improve the data retention characteristic. In data reading, if the voltage level of the storage node of a selected memory cell (read memory cell) increases due to the capacitive coupling of the cell plate line, voltage change of the bit line decreases because of the increase of the voltage level of the storage node in reading L level data, resulting in decrease of the sensing margin. By fixing the voltage of the cell plate line, change of the voltage level of storage data of a selected memory cell caused by the capacitive coupling can be prevented to correctly read memory cell data. These advantages can be achieved by using complementary control signals.

(Fourth Embodiment)

Figure 23:
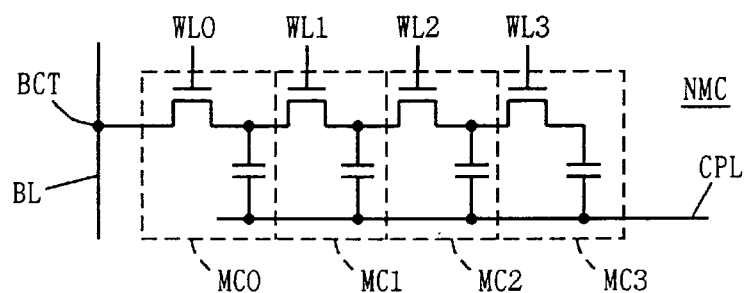
FIG. 23 shows a structure of an NAND type cell used in a fourth embodiment of the invention.

FIG. 23 schematically shows a structure of a memory cell of a semiconductor memory device according to the fourth embodiment of the invention. Referring to FIG. 23, an NAND type memory cell NMC includes four memory cells MC0–MC3 connected in series. Each of memory cells MC0–MC3 is the 1-transistor/1-capacitor type cell having one transistor and one-capacitor. Memory cells MC0–MC3 respectively include access transistors responsive to the signal potential on word lines WL0–WL3 to become conductive. NAND type cell NMC including four memory cells MC0–MC3 connected in series is connected to a bit line BL via a bit line contact BCT. The memory cells of a column connected to bit line BL are commonly provided with a cell plate line CPL that applies cell plate voltage to the cell plate nodes of the capacitors. The number of bit line contacts can be reduced by connecting four memory cells in series and connecting them to bit line BL via one bit line contact BCT, and accordingly memory cells can be arranged with a high density. In the fourth embodiment, a highly integrated array arrangement with a high density is implemented using the NAND type cell NMC.

Figure 24:
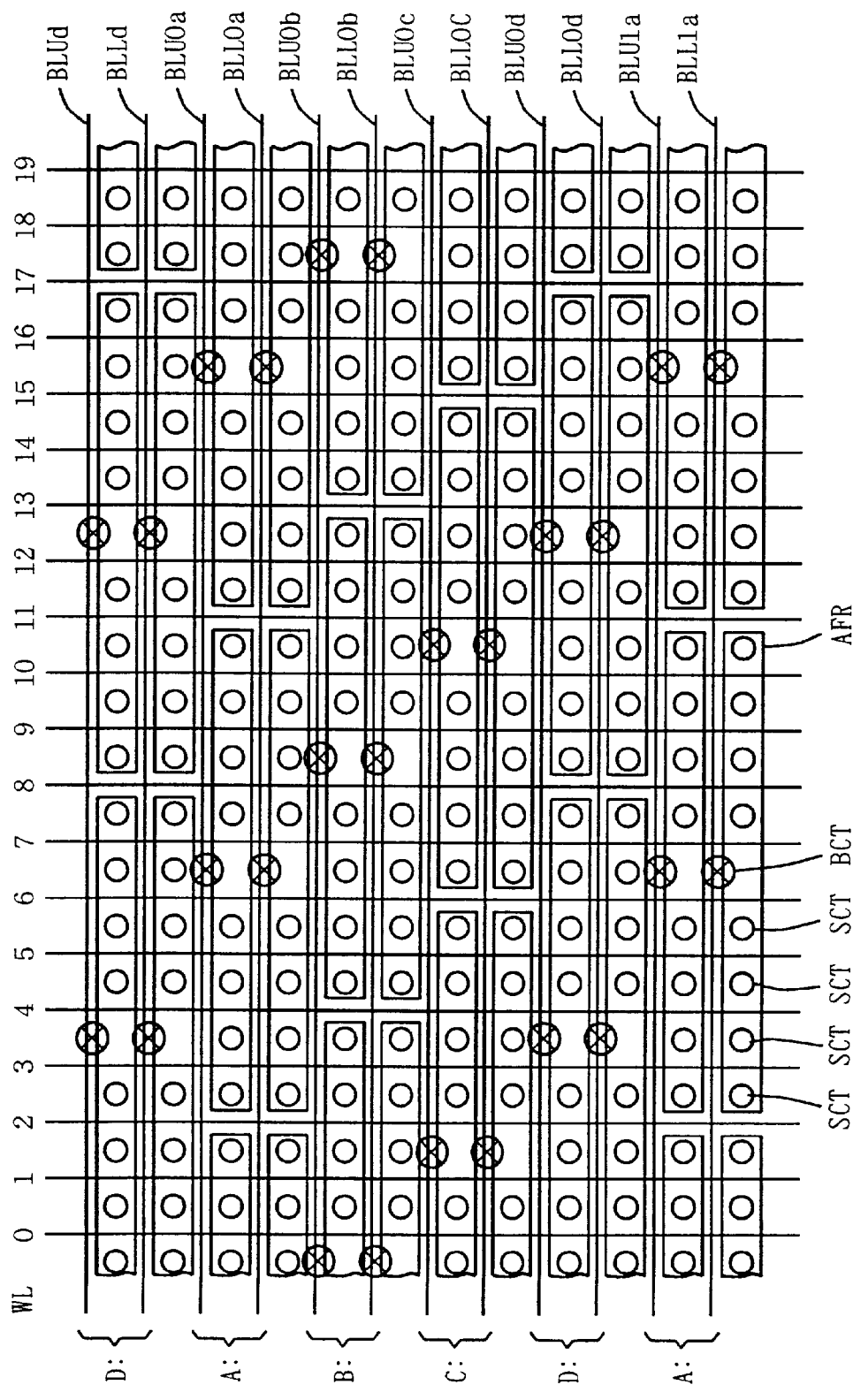
FIG. 24 schematically shows a memory cell arrangement of a semiconductor memory device according to the fourth embodiment of the invention.

FIG. 24 schematically shows an arrangement of memory cells of the semiconductor memory device according to the fourth embodiment of the invention. Referring to FIG. 24, two NAND type cells are arranged opposite to each other relative to bit line contact BCT in one active region AFR. One NAND type cell includes four memory cells of the 1-transistor/1-capacitor type connected in series. Basically bit line contacts are periodically arranged to be shifted in the column direction by one memory cell with four bit lines as a unit. According to the configuration shown in FIG. 24, two bit lines adjacent to each other have bit line contacts in the same positions. This is because a cell plate line is commonly provided to paired bit lines (similarly to the second embodiment). One word line is provided between NAND type cells adjacent to each other in the column direction. Accordingly, bit line contacts BCT are arranged in the column direction with nine word lines as a unit (every nine word lines). If the bit line pitch is 2·F and the word line pitch is 2·F, the occupation area of a bit of a memory cell is $4.5F^2$ ($2 \cdot F \cdot 2 \cdot F \cdot 9/8 = 4.5F^2$), and a significant reduction of the occupation area per one bit memory cell is achieved.

In FIG. 24, bit lines BLU0, BLL0a, BLU0b, BLL0b, BLU0c, BLL0c, BLU0d, BLL0d, BLU1a and BLL1a are shown. Sensing operation for bit lines BLU0a–BLU0d is performed by a sense ampler provided on one side of the memory cell array, and sensing operation for bit lines BLL0a–BLL0d is performed by a sense amplifier provided on the other side of the memory cell array. The bit lines are accordingly divided into four groups A, B, C and D. One sense amplifier is provided per four bit lines.

Figure 25:
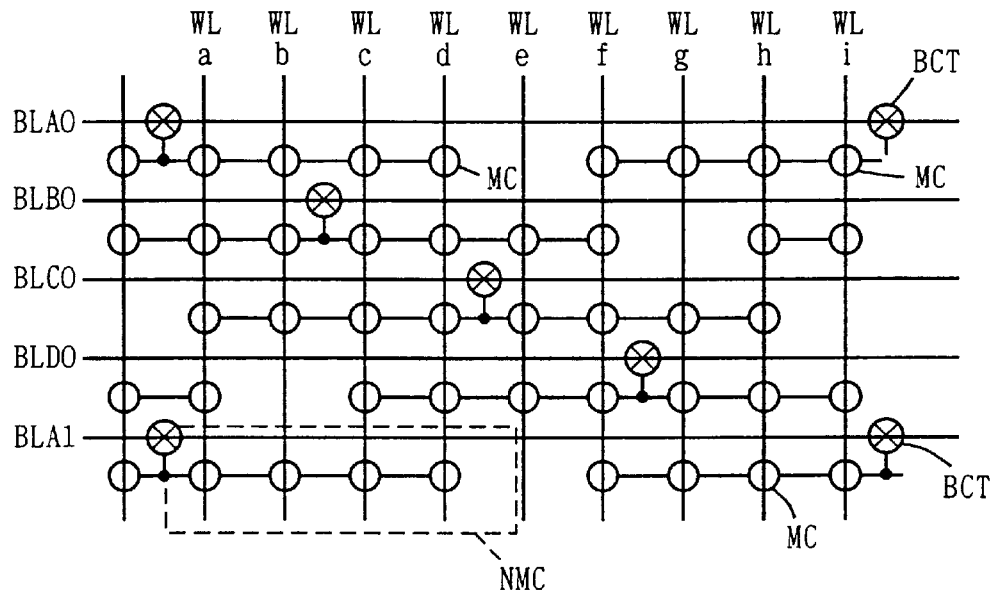
FIG. 25 schematically shows a basic arrangement of the memory cell arrangement shown in FIG. 24.

FIG. 25 schematically shows an arrangement of memory cells MC corresponding to one set of bit lines (four bit lines) BLA0–BLD0. The same pattern of the memory cell arrangement is repeated in the row direction with bit lines BLA0–BLD0 as one unit. A memory cell unit formed of two NAND type cells is repeatedly arranged in the column direction. Bit line contacts BCT are placed at the same position in the row direction every three bit lines (with four bit lines as a unit). In the column direction, bit line contacts BCT are formed every nine word lines. Accordingly, an empty region (a region where there is no memory cell at crossing of word line and bit line) is formed every eight word lines (with nine word lines as a unit) in the column direction. The empty region of memory cells is formed in each column for one set of bit lines with two word lines as a unit in the column direction. There is no empty region at word lines WLc, WLd, WLf and WLh.

Figure 26:
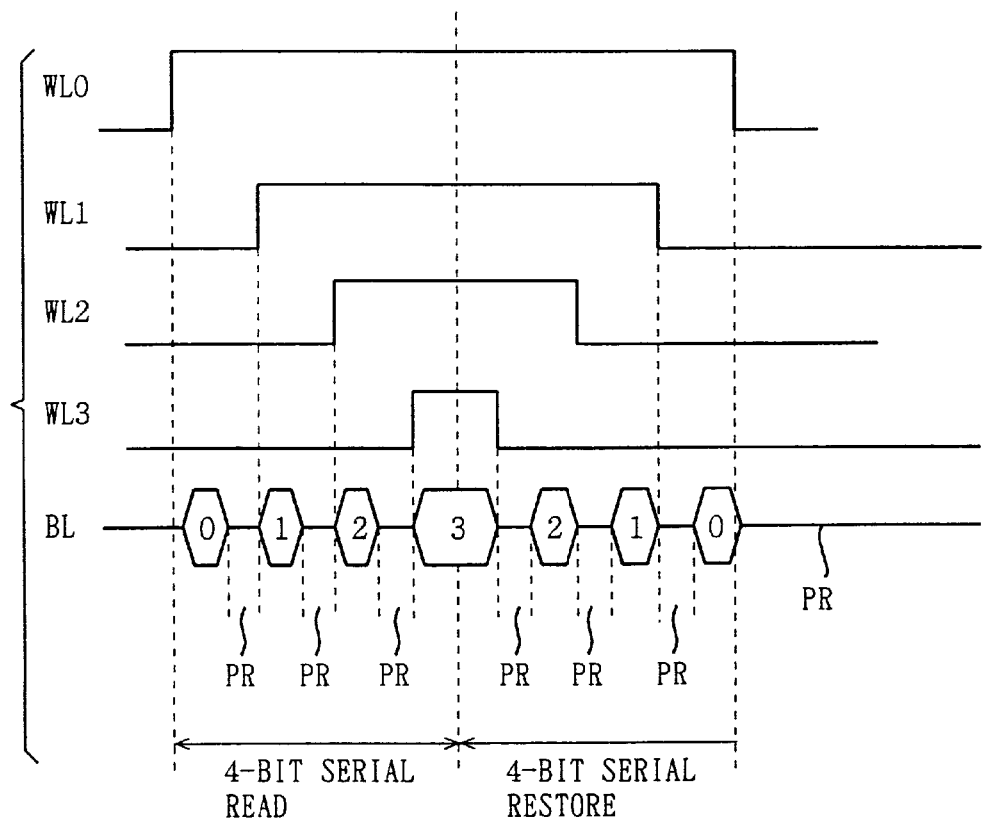
FIG. 26 shows signal waveforms representing data reading operation of the semiconductor memory device according to the fourth embodiment of the invention.

FIG. 26 shows waveforms respecting data reading operation of one NAND type cell. When one NAND type cell is selected, data of four bit memory cells are serially read and subsequently restored serially. FIG. 26 shows data reading operation of the NAND cell illustrated in FIG. 23. Word lines are successively activated starting from the word line which in turn is closest to the bit line contact. In FIG. 26, word lines WL0, WL1, WL2 and WL3 are successively driven into a selected state. When a word line is selected, data of corresponding memory cell is read onto a bit line. Every time each memory cell data is read, sensing operation by a sense amplifier is performed, and the data is latched by a register (not shown). The register is a four-bit register that successively stores the successively read data.

After data corresponding to one memory cell is stored by the register, the bit line is precharged into its original state again. After the bit line returns to the precharge state, next word line is selected, sensing operation is carried out, and amplified data is stored by the register. This operation is successively repeated. When word line WL3 is driven to the selected state, data of memory cell MC3 connected to word line WL3 is read onto bit line BL. At this time, data of memory cells respectively connected to word lines WL0–WL2 respectively have been returned to a precharged voltage level (precharge to an intermediate voltage level) after the data are read, and data of each memory cell is consequently read destructively.

After data of four bits of the memory cells are read, data stored in the register are rewritten into the memory cells. After the data is again rewritten into memory cell MC3 connected to word line WL3, word line WL3 is driven into a non-selected state. In this state, bit line BL is again precharged to the intermediate voltage level. Therefore, when memory cell data is rewritten, the voltage level of the storage node of the memory cell connected to the selected word line in the active state is precharged to the intermediate voltage level every time data is rewritten, and the data is rewritten into the storage node precharged to the precharge voltage level. When word line WL2 is in the selected state, re-writing of data into memory cell MC2 is carried out via memory cells MCG and MC1. Word line WL2 is thereafter driven into the non-selected state, and the capacitor of memory cell MC2 and bit line are disconnected. Re-writing of data into memory cells MC1 and MC0 connected to word lines WL1 and WL0 are thereafter performed similarly.

When data is sensed and amplified, the sense amplifier carries out sensing operation in "folded bit line arrangement." By controlling the voltage of the cell plate line and the voltage of the bit line correspondingly to the group of a selected word line to provide a memory cell data retention bit line, a reference bit line and a read bit line, data is amplified using the reference bit line and the read bit line.

Referring to FIG. 25 again, bit line contacts BCT are arranged to be shifted in the column direction by two word lines relative to the row direction in the basic arrangement (cell arrangement corresponding to one sense amplifier). When four word lines are selected, there are three cases as to the positional relation between the bit line contact and selected word lines as described below.

Figure 27A:
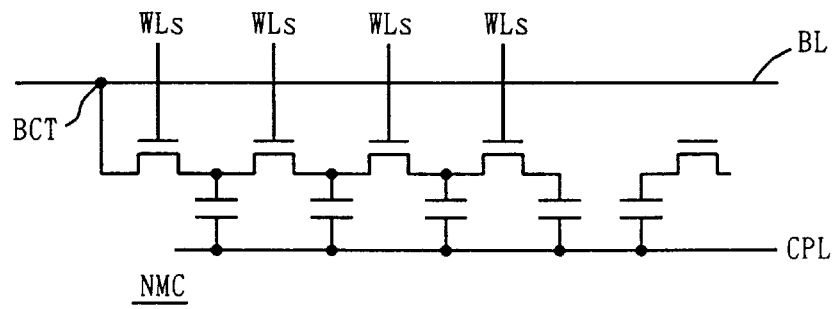
FIGS. 27A–27C each schematically show a positional relation between a selected word line and a bit line contact.

Referring to FIG. 27A, when selected word lines WLs select all of the four bits memory cells of one NAND type cell NMC, the four bit memory cells are connected to bit line BL successively via bit line contact BCT. In this case, bit line BL is used as a read bit line to read four bits of data. The voltage of corresponding cell plate line CPL is held at the level of intermediate voltage Vcca/2 (or held in the floating state).

Figure 27B:
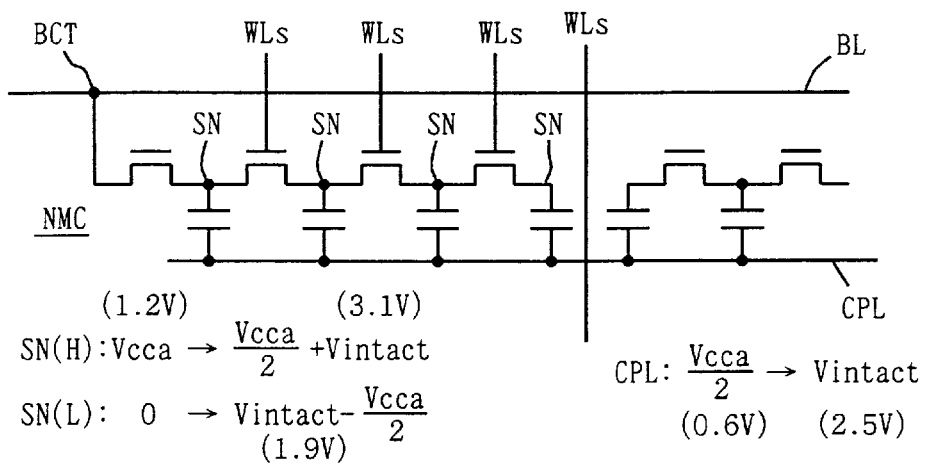

Referring to FIG. 27B, when there is at least one bit of a non-selected memory cell between four selected word lines and bit line contact BCT, data of NAND type memory cell NMC is not transmitted onto bit line BL via bit line contact BCT. In this case, the voltage level of cell plate line CPL is increased to retention voltage Vintact in order to prevent storage data of storage node SN from being destructed by selected word lines WLs. The voltage level of storage nodes SN of memory cells included in NAND type cell NMC is Vintact+Vcca/2 or Vintact−Vcca/2 which is higher than the voltage level of selected word lines WLs, so that access transistors all maintain OFF state. Accordingly, destruction of data stored in each memory cell of NAND type memory cell NMC caused by short circuit via access transistors is prevented. In the state shown in FIG. 27, data is not read onto bit line BL. In this case, bit line BL is used as a reference bit line.

Figure 27C:
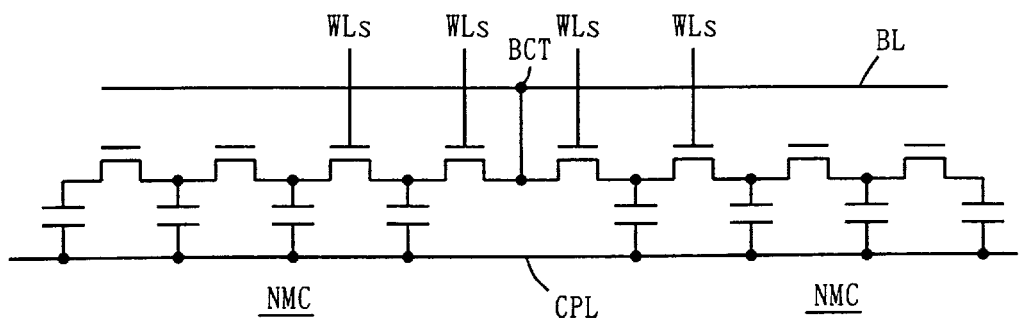

Referring to FIG. 27C, when bit line contact BCT is located between four selected word lines WLs, data of two NAND type cells could be read. In this case, the voltage levels of bit line BL and cell plate line CPL are both increased from intermediate voltage level Vcca/2 to memory cell data retention voltage level Vintact. Access transistors included in two NAND type cells NMC are all maintained in OFF state to prevent destruction of storage data. In this case, bit line BL is the data retention bit line that is not connected to the sense amplifier.

Depending on the positions of selected word lines, bit line BL shown in FIG. 27A is used as a read bit line, and bit line BL shown in FIG. 27B is used as a reference bit line to perform sensing operation.

Now, next, a correspondence between selected word lines in the memory cell array and each control signal is described.

Figure 28:
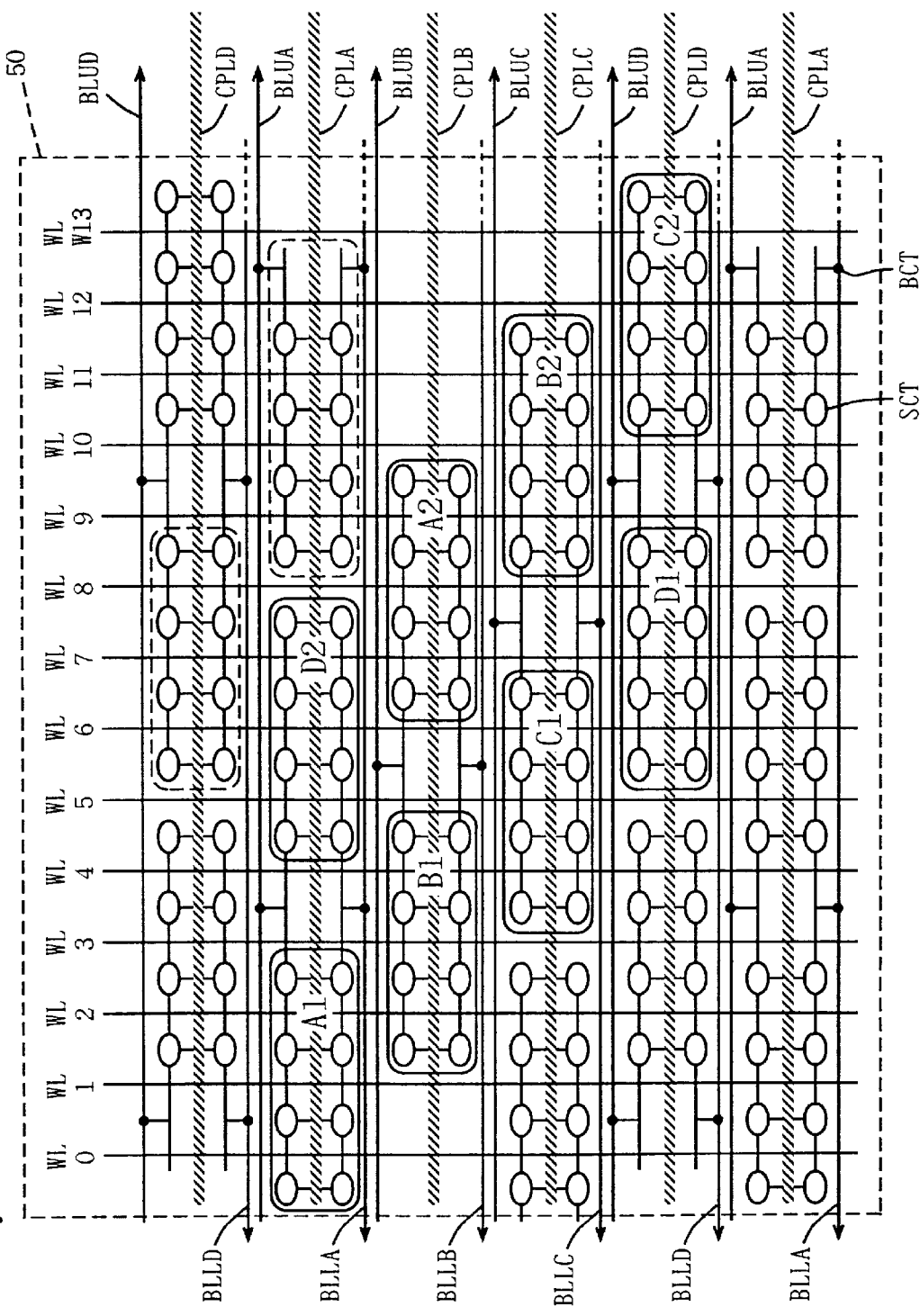
FIG. 28 representatively shows selected memory cells in the memory cell arrangement according to the fourth embodiment of the invention.

FIG. 28 schematically shows a configuration of a memory cell array. Referring to FIG. 28, two bit lines BLU and BLL adjacent to each other form a pair to be arranged and have bit line contacts at the same positions. For bit lines BLLA–BLLD, a sense amplifier placed on one side of a memory cell array 50 performs sensing operation, and for bit lines BLUA–BLUD, a sense amplifier placed on the other side of memory cell array 50 performs sensing operation. Paired bit lines BLU (BLUa–BLUd) and BLL (BLLa–BLLd) share a cell plate line CPL (CPLa–CPLd). Bit line contacts BCT are arranged to be shifted by two word lines in the column direction relative to the row direction. In the basic arrangement shown in FIG. 28, selection on eight NAND type cells A1–D1 and A2–D2 is made corresponding to the positional relation between four word lines that are simultaneously selected and the bit line contact. According to the positions of selected word lines, the manner of reading from eight NAND type cells is repeated in the column direction.

Figure 29:
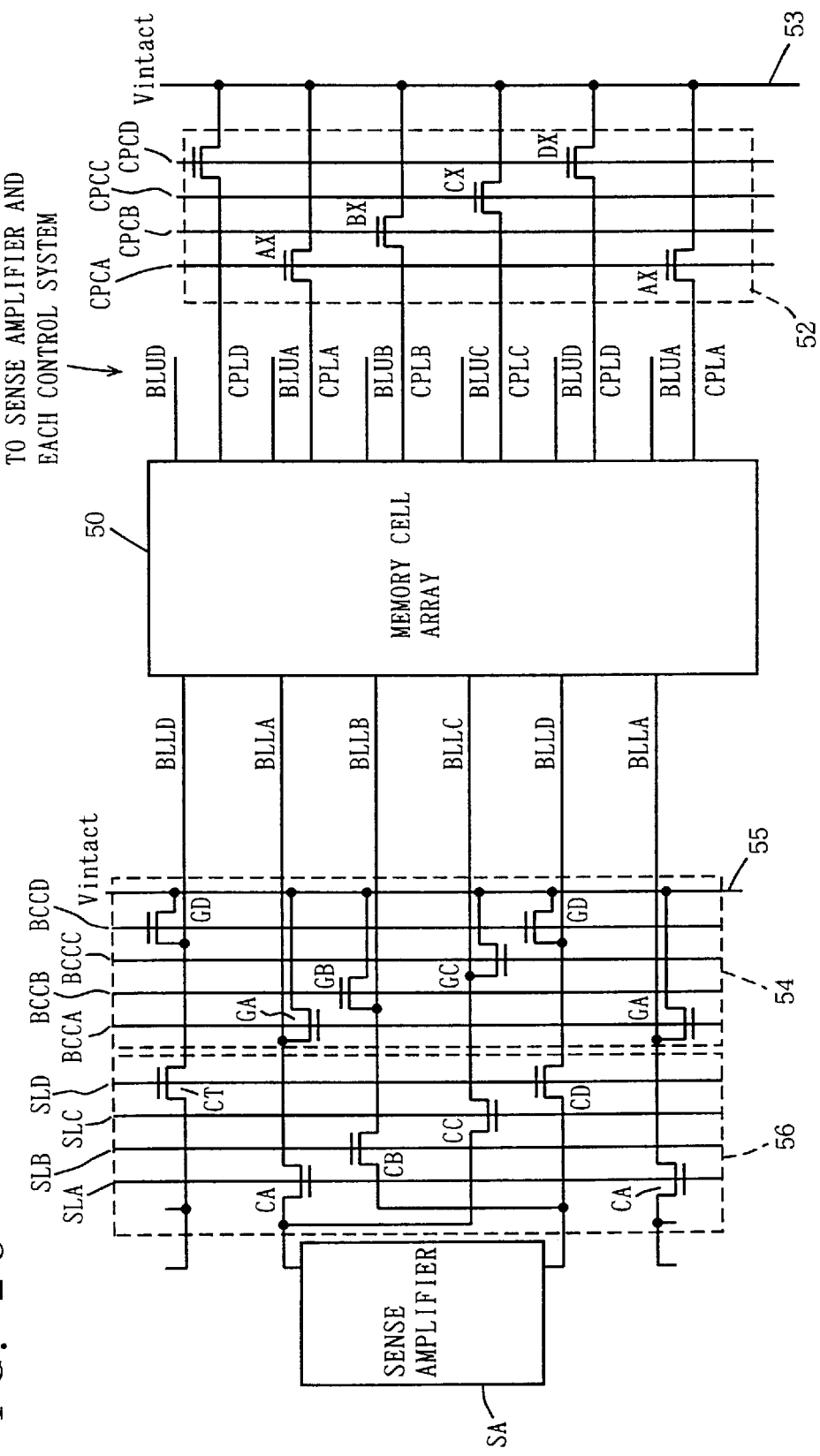
FIG. 29 shows a structure of a main portion of the semiconductor memory device according to the fourth embodiment of the invention.

FIG. 29 illustrates structures of circuits controlling voltage of cell plate lines CPLA–CPLD, and bit lines BLLA–BBLD and BLUA–BLUD included in memory cell array 50. FIG. 29 shows a bit line voltage control circuit 54 and a sense amplifier connection control circuit 56 provided corresponding to bit lines BLLA–BLLD. A bit line voltage control circuit and a sense amplifier connection control circuit are also provided to bit lines BLUA–BLUD. One sense amplifier SA is provided corresponding to four bit lines BLLA–BLLD. Bit lines BLUA–BLUD are also provided with a sense amplifier (not shown) as in the second embodiment. A cell plate line voltage control circuit 52 includes transmission gates AX–DX provided corresponding to respective cell plate lines CPLA–CPLD and responsive to cell plate voltage control signals CPCA–CPCD to selectively become conductive. Transfer gates AX–DX connect corresponding cell plate lines CPLA–CPLD to a memory cell data retention voltage transmission line 53 when they become conductive.

Bit line voltage control circuit 54 includes transfer gates GA–GD provided corresponding to respective bit lines BLLA–BLLD and responsive to bit line voltage control signals BCCA–BCCD to selectively transmit memory cell data retention voltage Vintact. Memory cell data retention voltage Vintact is transmitted onto a memory cell data retention voltage transmission line 55. Transfer gates GA–GD connect corresponding bit lines BLLA–BLLD to memory cell data retention voltage transmission line 55 when they are conductive.

Sense amplifier connection control circuit 56 includes transfer gates CA–CD provided corresponding to respective bit lines BLLA–BLLD and responsive to connection control signals SLA–SLD to selectively become conductive and connect corresponding bit lines to sense amplifier SA. Transfer gates CA and CC connect bit lines BLLA and BLLC to one sense node of sense amplifier SA when they are conductive, and transfer gates CB and CD connect bit lines BLLB and BLLD to the other sense node of sense amplifier SA when they are conductive.

FIG. 30 shows in a table the correspondence between selected word lines and each control signal when NAND type cells A1–D1 and A2–D2 are read in the structure shown in FIGS. 28 and 29. Word lines WL are successively selected with four word lines as a unit. In this case, the selection sequence of word lines is different depending on whether a leading word line is on the right side of the bit line contact or the left side thereof. For example, referring to FIG. 28, when NAND type cell A1 is read, word line WL3 is designated as a leading word line, and word lines WL3, WL2, WL1 and WL0 are driven into the selected state in this order and memory cell data are read. On the contrary, when the data are restored, word lines WL0, WL1, WL2 and WL3 are successively driven into an inactive state. When data of NAND type cell A1 is read, bit lines BLLA and BLUA are read bit lines, and bit lines BLLB and BLUB are reference bit lines. Bit lines BLLC, BLUC, BLLD and BLUD are memory cell data retention bit lines. Control signals BCCC and BCCD are in the active state, gates GC and GD shown in FIG. 29 are in the ON state, and memory cell data retention voltage Vintact is transmitted onto bit lines BLLC and BLLD and bit lines BLUC and BLUD (not shown). Concerning the cell plate line, the voltage of cell plate lines except the cell plate line corresponding to read bit lines should be set at memory cell data retention voltage Vintact, control signals CPCA, CPCC, and CPCD are all set at H level and gates BX, CX and DX are driven to ON state.

In sense amplifier selection connection control circuit 56, connection control signals SLA and SLB are set into the active state of H level, and transfer gates CA and CB are driven to ON state in order to connect bit lines and BLLB to sense amplifier SA. When a word line on the right side of the bit line contact is selected, word lines are successively selected in the order of increasing number when data are read. For example, if word line WL6 is selected as a leading word line, word lines are driven into the selected state in the order of word lines WL6, WL7, WL8 and WL9. When word line WL6 is selected as a leading word line, NAND type cell A2 is selected as shown in FIG. 28. In this state, bit lines BLUB and BLLB are read bit lines, and the voltage level of cell plate line CPLB is maintained at the level of intermediate voltage Vcca/2 by an MOS transistor for precharge (not shown). Other cell plate lines CPLA, CPLC and CPLD are driven to the voltage level of the memory cell data retention voltage Vintact. When word lines WL6–WL9 are selected, data of NAND type cells C1, B2 and D1 are read. In order to inhibit this reading operation, bit lines BLUC, BLLC, BLLD and BLUD are driven to the level of memory cell data retention voltage Vintact. Bit lines BLUA and BLLA are used as reference bit lines since memory cell data are not read onto bit lines BLUA and BLLA. Accordingly, control signals BCCC, BCCB, CPCA, CPCC and CPCD are at H level, and control signals SLA and SLB are at H level. Bit lines BLLA and BLLB are connected to sense amplifier SA shown in FIG. 29.

Similarly, data of NAND type cell B1 is read when word line WL5 is a leading word line, data of NAND type cell C1 is read when word line WL7 is a leading word line, and data of NAND type cell D1 is read when word line WL9 is a leading word line. In these cases, word lines WL are successively driven into the selected state in the order of decreasing number. If word lines WL4, WL6, WL8 and WL10 are leading word lines, data of NAND type cells D2, A2, B2 and C2 are respectively read. In these cases, word lines are successively driven into the selected state in the order of increasing number.

For one basic arrangement (a set of four bit lines), bit line contacts BCT are arranged to be shifted in the column direction by two word lines. No memory cell is connected to a word line placed between two NAND type cells adjacent to each other in the column direction. In the column direction, the bit line contacts are formed every nine word lines. Utilizing these characteristics, each of control signals CPCA–CPCD, BCCA–BCCD and SLA–SLD is selectively driven into the active state, according to selected word lines.

Figures 31, 32:
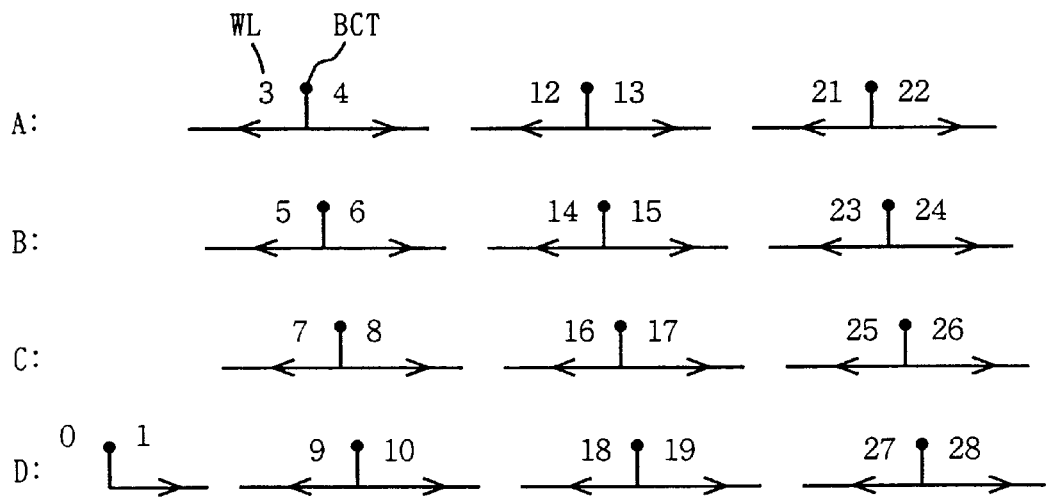
FIG. 31 schematically shows a positional relation between a bit line contact and a selected word line.
FIG. 32 shows in a table selected word line, a read bit line, a reference bit line and a word line selection sequence shown in FIG. 31.

FIG. 31 schematically shows a correspondence between bit line contact BCT of each bit line and word lines WL on both sides of the bit line contact BCT. Referring to FIG. 31, bit lines BLLA and BLUA are shown as group A, bit lines BLUB and BLLB are shown as group B, bit lines BLUC and BLLC are shown as group C, and bit lines BLUD and BLLD are shown as group D.

For group A, bit line contacts BCT are respectively formed between word lines WL3 and WL4, WL12 and WL13, and WL21 and WL22. For group B, bit line contacts BCT are respectively placed between word lines WL5 and WL6, word lines WL14 and WL15, and word lines WL23 and WL24.

For group C, bit line contacts BCT are respectively formed between word lines WL7 and WL8, word lines WL16 and WL17, and word lines WL25 and WL26.

For group D, bit line contacts are placed, as shown in FIG. 28, between word lines WL0 and WL1, WL9 and WL10, WL18 and WL19, and WL27 and WL28. For each of groups A–D, when one of the two word lines adjacent to bit line contact BCT is designated as a leading word line, data is read using a bit line connected to the bit line contact as a read bit line. As clearly shown by the correspondence illustrated in FIG. 31, bit line contacts BCT are formed every nine words in the column direction, and leading word lines are arranged to be shifted by two word lines in the column direction relative to the row direction. Following the relation between the bit line contact and selected word lines, a general correspondence between selected word lines and a group to which read bit lines belong for generating each control signal can be determined.

FIG. 32 shows a relation of a selected word line, a read bit line and a reference bit line according to the fourth embodiment of the invention. When a bit line included in group A is to be a read bit line, a selected word line is word line $9n+3$ or word line $9n+4$. When word line $9n+3$ is selected, bit line BLB of group B is used as a reference bit line. When word line $9n+4$ is designated as a leading word line, bit line BLD of group D is used as a reference bit line. When word line $9n+5$ or word line WL$9n+6$ is selected as a leading word line, data is read onto bit line BLB of group B. When word line WL9n+5 is designated as a leading word line, bit line BLC of group C is used as a reference bit line, and when word line WL9n+6 is designated as a leading word line, bit line BLA of group A is designated as a reference bit line.

For group C, when word line WL9n+7 or word line WL9n+8 is selected, data is read onto to bit line BLC of group C. When word line WL9n+7 is a leading word line, bit line BLD is used as a reference bit line. When word line 9n+8 is designated as a leading word line, bit line BLB of group B is used as a reference bit line. When word line WL9n or word line WL9n+1 is designated as a leading word line, data is read onto bit line BLD of group D. When word line WL9n is a leading word line, bit line BLA of group A is used as a reference bit line. When word line WL9n+1 is a leading word line, bit line BLC of group C is used as a reference bit line.

The word lines can be classified by a residue system of 9. For groups A, B and C, word lines are successively driven into the selected state from a word line of greater number to a word line of smaller number in a word line selection sequence when the reminder of the residue system of 9 is an odd number (3, 5, 7). For group D, a word line selection sequence is such that word lines are successively selected from a word line of greater number to a word line of smaller number when the number of a selected word line is a multiple of 9. For groups A, B and C, when the reminder of the residue system of 9 is an even number, word lines are successively selected from a word line of smaller number to a word line of greater number. For group D, when word line WL9n+1 is selected as a leading word line, word lines are successively selected from a word line of smaller number to a word line of greater number. Utilizing the relation illustrated in FIG. 32, each control signal can be generated.

Figure 33:
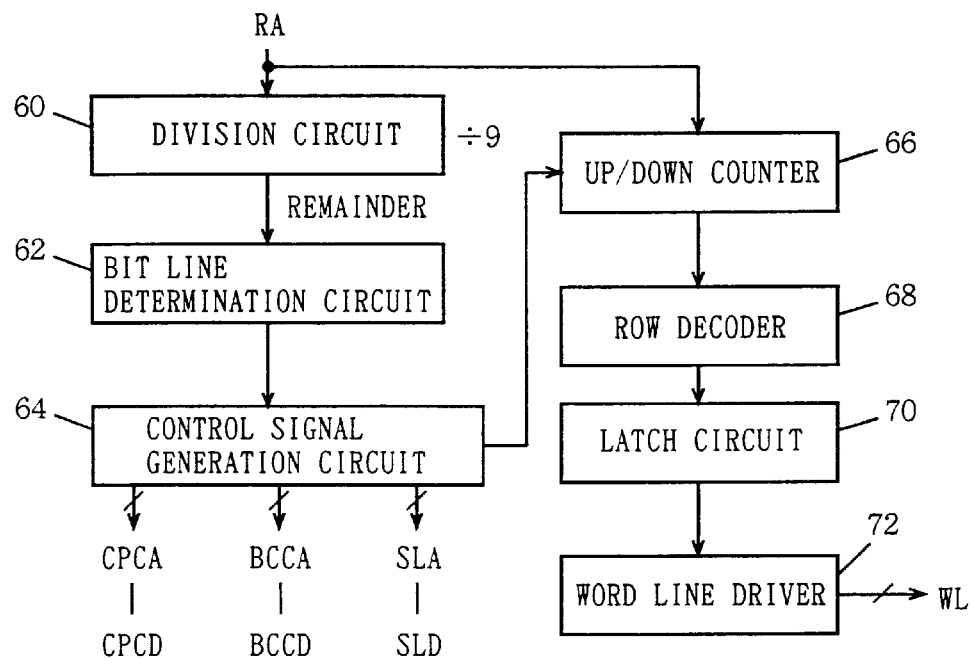
FIG. 33 schematically shows a structure of a control circuit and a row drive circuit according to the fourth embodiment of the invention.

FIG. 33 schematically shows a structure of a control circuit of the semiconductor memory device according to the fourth embodiment of the invention. Referring to FIG. 33, the control circuit includes a division circuit 60 dividing row address RA by 9, a bit line determination circuit 62 receiving data representing the reminder supplied from division circuit 60 and specifying a read bit line, and a control signal generation circuit 64 outputting control signals CPCA–CPCD, BCCA–BCCD and SLA–SLD in accordance with bit line specification signal supplied from bit line determination circuit 62.

Bit line determination circuit 62 generates information concerning a bit line group, and concerning which of two word lines sandwiching a bit line contact in each group is selected, according to data representing the reminder supplied from division circuit 60.

Control signal generation circuit 64 determines a read bit line and a reference bit line shown in FIG. 32, according to the bit line specification signal supplied from bit line determination circuit 62, to generate each control signal.

A word line selection circuit includes an up/down counter 66 latching row address signal RA as an initial value, a row decoder 68 decoding an internal address signal supplied from up/down counter 66, a latch circuit 70 latching a signal output from row decoder 68, and a word line driver 72 driving a designated word line to a selected state according to a signal output from latch circuit 70.

Up/down counter 66 determines a selection sequence for word lines according to a control signal from control signal generation circuit 64. Up/down counter 66 is activated at the start of a memory cycle (when internal row address strobe signal is activated) to perform counting operation every time a word line is selected. Latch circuit 70 is provided for keeping a selected word line in the selected state for a necessary period when four word lines are successively selected. Latch circuit 70 latches a signal output from each decoder included in row decoder 68, and is reset to an initial state when a memory cycle completes.

Four word lines may be selected successively according to toggle of an external row address strobe signal. Alternatively, an internal row address signal of a prescribed time width may be internally generated four times when an external row address strobe signal is activated.

As illustrated in FIG. 33, a read bit line can be specified by classifying row address signals by the residue system of 9. Each of control signals CPCA–CPC0, BCCA–BCCD, and SLA–SLD can be output following the specified read bit line information. Further, a word line selection sequence can be set in up/down counter 66.

The residue system of 9 is employed in the structure shown in FIG. 33. However, a leading word line may be specified using a signal output from the row decoder as illustrated in the first embodiment (see FIG. 18), or an ROM table may be used (see FIG. 17 and FIG. 18). In addition, the internal structure of control signal generation circuit 64 is the same as that of the setting circuit shown in FIG. 16, and one of eight kinds of control signal generation manners may be selected according to bit line specification information. If word lines are specified according to an output from the row decoder similarly to the structure shown in FIG. 18, a read bit line and a reference bit line can be easily specified by dividing the row decoder into eight groups.

Figure 34:
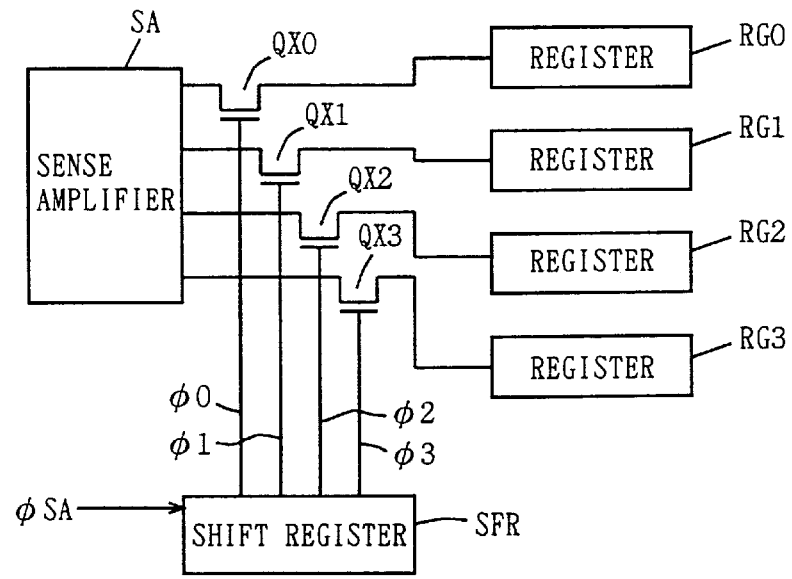
FIG. 34 schematically shows a structure of a sense amplifier portion according to the fourth embodiment of the invention.

FIG. 34 schematically shows a structure of a sense amplifier portion when four bit data are serially read. Four-bit registers RG0–RG3 are provided correspondingly to a sense amplifier SA. Four registers RG0–RG3 are respectively connected to sense amplifier SA via transfer gates QX0–QX3. Control signals $\phi 0$–$\phi 3$ are respectively supplied from a four-bit shift register SFR to transfer gates QX0–QX3. Shift register SFR is responsive to activation of sense amplifier activation signal (or word line activation signal) $\phi SA$ to perform shifting operation, and drives any of control signals $\phi 0$–$\phi 3$ to the active state only when sense amplifier activation signal (or word line activation signal) $\phi SA$ is activated.

Shift register SFR drives control signals $\phi 0$–$\phi 3$ successively to the active state in a prescribed sequence (e.g. $\phi 0 \rightarrow \phi 3$) in response to activation of sense amplifier activation signal (or word line activation signal) $\phi SA$, and subsequently in restoring drives control signals $\phi 0$–$\phi 3$ to the active state in a sequence of the reverse order to that in data reading (e.g, $\phi 3 \rightarrow \phi 0$). The structure of the shift register for performing such bidirectional shifting operation is easily implemented by just reversing the internal generation sequence of the shift clock depending on data reading and data restoring. Alternatively, a structure for generating four control signals using a two bit up/down counter and a decode circuit may be employed.

Registers RG0–RG3 are just required to have an ordinary latch function. Bidirectional data transfer between sense amplifier SA and registers RG0–RG3 is easily achieved by utilizing a structure in which a latching ability of registers RG0–RG3 is set higher than that of sense amplifier SA, the latching function is stopped when data from sense amplifier SA is stored, and latching is performed responsive to inactivation of the sense amplifier. Note that the entire structure is similar to that illustrated in FIG. 21.

According to the fourth embodiment of the invention, the bit line contacts are arranged to be shifted by two word lines relative to the row direction using the NAND type cells. A read bit line and a reference bit line are implemented by adjusting the voltage of the bit line and the cell plate line with four bit lines as a unit, and a memory cell occupation area per one bit can be significantly decreased to achieve a highly integrated semiconductor memory device with a high density.

(Fifth Embodiment)

Figure 35:
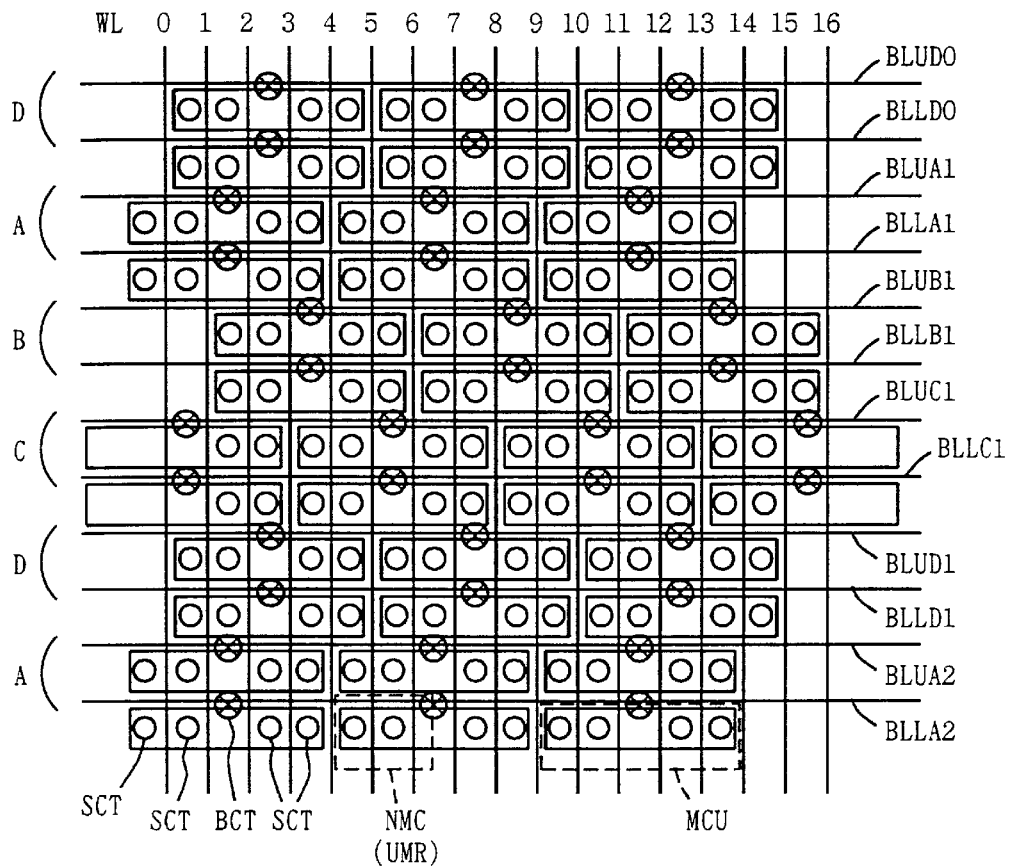
FIG. 35 schematically shows a memory cell arrangement of a semiconductor memory device according to a fifth embodiment of the invention.

FIG. 35 schematically shows a configuration of a memory cell array portion of a semiconductor memory device according to the fifth embodiment of the invention. Two bit lines having the same memory cell arrangement form a pair to be arranged in the configuration illustrated in FIG. 35. A cell plate line is commonly provided to the paired bit lines having the same memory cell arrangement (not shown in FIG. 35). In the configuration shown in FIG. 35, an NAND type cell NMC includes two 1-transistor/1-capacitor type memory cells connected in series and opposite to each other relative to a bit line contact. In the column direction, bit line contacts BCT are periodically formed with five word lines as a unit. For a set of eight bit lines BLUA1, BLLA1, BLUB1, BLLB1, BLUC1, BLLC1, BLUD1 and BLLD1, bit line contacts are arranged to be shifted by two word lines relative to the row direction. The positional relation among bit line contacts in the set of bit lines is the same as the positional relation of arrangement of bit line contacts according to the fourth embodiment.

For bit lines BLLA1, BLLB1, BLLC and BLLD1, a sense amplifier placed on one side of the memory cell array is used to amplify storage data. For bit lines BLUA1, BLUB1, BLUC1 and BLUD1, a sense amplifier placed on the other side of the memory cell array is used to sense and amplify storage data. The relation of arrangement between the bit lines and the sense amplifiers is the same as that according to the fourth embodiment.

In the memory cell array arrangement illustrated in FIG. 35, a memory cell minimum unit MCU includes four one transistor/one capacitor type memory cells and occupies a pitch area corresponding to five word lines in the column direction. If a bit line and a word line both have the pitch of 2F, four memory cells occupy an area corresponding to 2·F·5·2·F. An occupation area UMR per a memory cell of one bit is accordingly 5·F². Compared with the conventional folded type bit line arrangement, the memory cell occupation area is 62.5% of the conventional one, and compared with the arrangement according to the first embodiment, the memory cell occupation area is 83.3% of that of the first embodiment. A memory cell arrangement suitable for higher integration is thus implemented. The layout of sense amplifier is made easy since only one sense amplifier is required for the pitch of eight bit lines on one side of a memory cell array.

Figure 36:
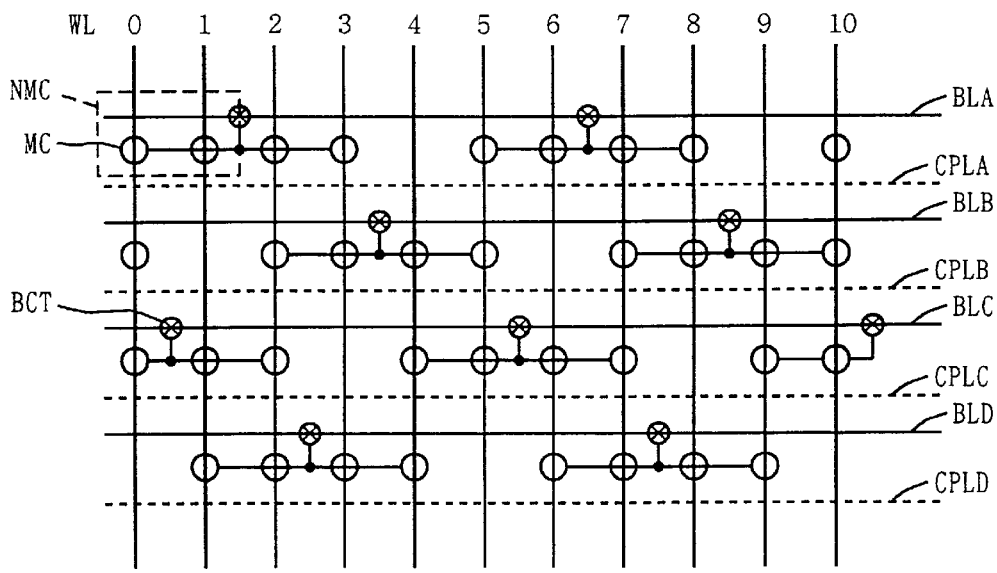
FIG. 36 schematically shows an electrically equivalent circuit of the memory cell arrangement shown in FIG. 35.

FIG. 36 illustrates a circuit which is electrically equivalent to the cell arrangement of the memory cell array shown in FIG. 35. FIG. 36 representatively shows a set of bit lines connected to a sense amplifier on one side of the memory cell array, or a set of four bit lines BLA, BLB, BLC and BLD. Cell plate lines CPLA–CPLD are arranged corresponding to respective bit lines BLA–BLD. Cell plate lines CPLA–CPLD are shared by bit lines BLL and BLU having the same memory cell arrangement in the configuration shown in FIG. 35.

Bit line contacts BCT are arranged to be shifted by two word lines in the column direction relative to the row direction. For bit line BLA, bit line contacts BCT are respectively formed between word lines WL1 and WL2, and word lines WL6 and WL7, and two-bits memory cells are connected to be opposite to each other relative to a bit line contact. For bit line BLB, bit line contacts are respectively formed between word lines WL3 and WL4, and word lines WL8 and WL9. For bit line BLC, bit line contacts are respectively formed between word lines WL0 and WL1, and word lines WL5 and WL6. And for bit line BLD, bit line contacts are respectively formed between word lines WL2 and WL3, and word lines WL7 and WL8. In the column direction, one empty region (a region where there is no memory cell) is arranged every four word lines with five word lines as a unit.

Employing the NAND type cell having two one transistor/ one capacitor type memory cells connected in series as shown in FIGS. 35 and 36, one reference bit line can be formed when one word line is selected since one empty region is provided for every five word lines in the column direction, and bit line contacts are shifted by two word lines relative to the row direction. The voltage of the cell plate line corresponding to the reference bit line is maintained at the level of memory cell data retention voltage Vintact. The voltage of the cell plate line corresponding to the read bit line is at the intermediate voltage level. For remaining two bit lines, memory cell data retention voltage Vintact is transmitted to both of these bit lines and the corresponding cell plate lines.

Figures 37, 38:
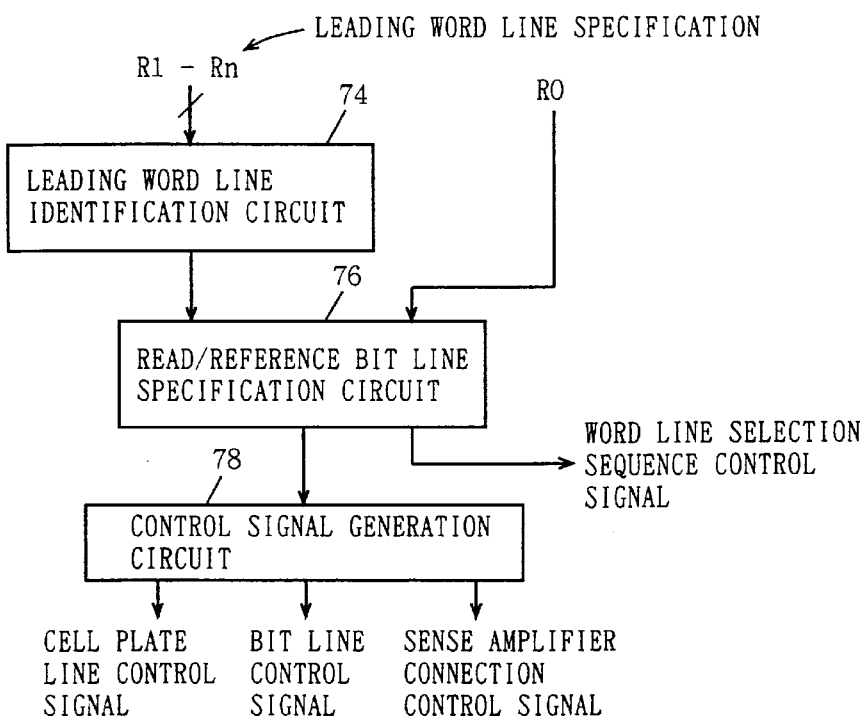
FIG. 37 shows in a table relation between a selected word line, a read bit line, a reference bit line and a word line selection sequence according to the fifth embodiment of the invention.
FIG. 38 schematically shows a structure of a control circuit according to the fifth embodiment of the invention.
Figure 39:
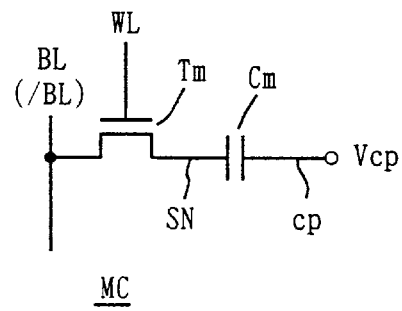
FIG. 39 shows a structure of a conventional memory cell of 1-transistor/1-capacitor type.
Figure 40:
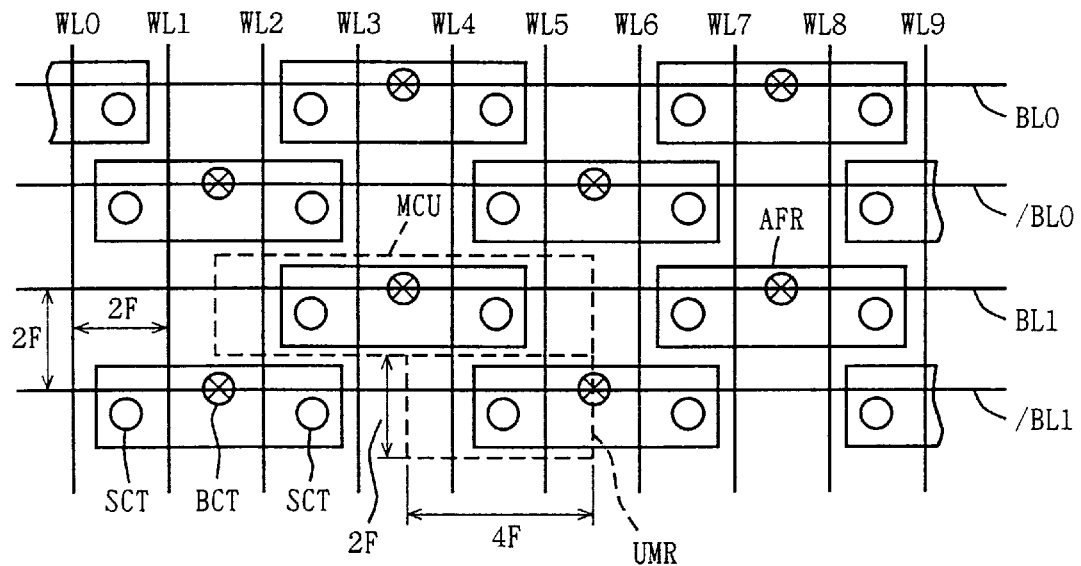
FIG. 40 schematically shows a memory cell arrangement in a conventional folded bit line arrangement.
Figure 41:
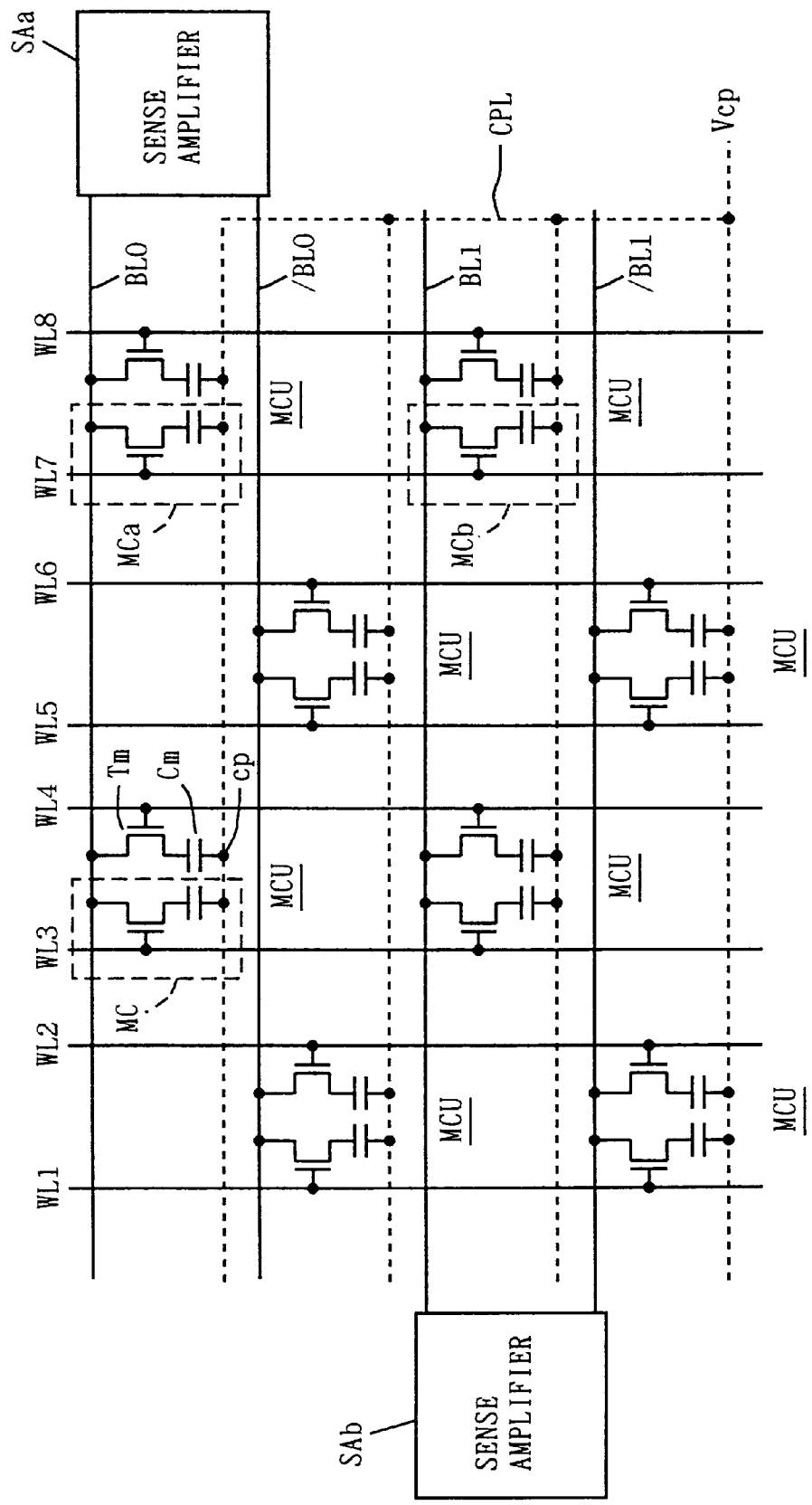
FIG. 41 shows an electrically equivalent circuit of the memory cell arrangement shown in FIG. 40.

FIG. 37 shows in a table a selected word line (leading word line), a read bit line, a reference bit line and a corresponding word line selection sequence in the memory cell arrangement shown in FIGS. 35 and 36. A selected word line (leading word line) is represented by the residue system of 5. This is because a basic memory cell unit is 4 bits and there is one empty region between basic units adjacent to each other in the column direction. A read bit line and a reference bit line can be determined following the positional relation between the selected word line (leading word line) and bit line contact BCT. When a selected word line (leading word line: hereinafter simply referred to as a selected word line) is word line WL5n+1, there are two bit lines BLA and BLC as the read bit lines. According to a word line selection sequence by which word lines are selected in the descending order of word line numbers, a read bit line is bit line BLA and reference bit line is bit line BLD. On the contrary, when word lines are successively selected in the ascending order of word line numbers, bit line BLC is a read bit line, and bit line BLB is a reference bit line.

When a selected word line is WL5n+2, one of bit lines BLA and BLD is a read bit line. When word lines are successively selected from a word line of larger number to a word line of smaller number following a word line selection sequence, bit line BLD is a read bit line and bit line BLB is a reference bit line. On the contrary, when word lines are successively selected from a word line of smaller number to a word line of larger number, bit line BLA is a read bit line and bit line BLC is a reference bit line.

When a selected word line is word line WL5n+3, one of bit lines BLB and BLD is a read bit line. When word lines are successively selected from a word line of larger number to a word line of smaller number, bit line BLB is a read bit line and bit line BLC is a reference bit line. When word lines are successively selected from a word line smaller number to a word line of larger number, bit line BLD is a read bit line and bit line BLA is a reference bit line.

When a selected word line is word line WL5n+4, bit line BLB is a read bit line and bit line BLA is a reference bit line. In this case, word lines are successively selected from a word line of smaller number to a word line of larger number.

When a selected word line is word line WL5n, a read bit line is bit line BLC and a reference bit line is bit line BLD. In this case, word lines are successively selected from a word line of larger number of a word line of smaller number.

When there are two read bit lines corresponding to one selected word line, the read bit line and the reference bit line are determined using a specific bit of an address signal to identify a word line selection sequence to be employed. When a selected word line is word line 5n+4 or 5n, the read bit line is uniquely determined. In this case, the specific address signal bit is made invalid, and word lines are successively driven into the selected state according to a predetermined word line selection sequence.

FIG. 38 schematically shows a structure corresponding to a portion for generating bit line and cell plate line voltage control signals as well as a sense amplifier connection control signal. Referring to FIG. 38, a control circuit includes a leading word line identification circuit 74 receiving row address signal bits R1–Rn to identify a selected word line (leading word line), a read/reference bit line specification circuit 76 receiving leading word line specification information from leading word line identification circuit 74 and a row address signal bit R0 to specify a read bit line and a reference bit line, and a control signal generation circuit 78 for generating a cell plate control signal for controlling the voltage of the cell plate line, a bit line control signal for controlling the voltage of the bit line, and a sense amplifier connection control signal for controlling connection between a sense amplifier and the bit line in accordance with read bit line and reference bit line specification signals from read/reference bit line specification circuit 76. Read/reference bit line specification circuit 76 generates a word line selection sequence control signal for designating a word line selection sequence according to row address signal bit R0 and a leading word line specification signal output from leading word line identification circuit 74.

Leading word line identification circuit 74 outputs a signal for specifying one of eight sets of selected word lines (leading word lines) shown in FIG. 37 according to row address signal bits R1–Rn. Read/reference bit line specification circuit 76 makes row address signal bit R0 invalid when a selected word line (leading word line) is word line WL5n+4 or word line WL5n, generates a word line selection sequence control signal according to the leading word line specification information, and generates signals for specifying the read bit line and the reference bit line.

When leading word line identification circuit 74 specifies a set of word lines corresponding to any of reminder 1, 2 and 3, read/reference bit line specification circuit 76 determines a pair of a read bit line and a reference bit line and determines a word line selection sequence according to the value of row address signal bit R0. Control signal generation circuit 78 sets cell plate lines except the cell plate line provided to a read bit line at the voltage level of memory cell data retention voltage Vintact, and sets the voltage of bit lines other than the read bit line and the reference bit line at the voltage level of memory cell data retention voltage Vintact according to read bit line specification information and reference bit line specification information supplied from read/reference bit line specification circuit 76.

The structure similar to that according to the first embodiment can be used for the structure of leading word line identification circuit 74. The circuit structure illustrated according to the fourth embodiment may be applied. Dividing by 5 a binary number represented by row address signal bits R1–Rn can classify word lines with the residue system of 5. Alternatively, a leading word line may be specified according to a row decoder output signal, or an ROM table may be employed.

The circuit portion receiving a control signal supplied from control signal generation circuit 78 may employ the structure similar to those of the bit line voltage control circuit and the cell plate line voltage control circuit illustrated in FIG. 21. The sense amplifier connection control circuit connects a read bit line and a reference bit line to different sense nodes of a sense amplifier respectively. Therefore, the number of transfer gates for connecting the sense amplifier and the bit lines is relatively greater compared with the fourth embodiment. The block diagram of remaining structure is the same as the circuit structure illustrated in FIG. 21 according to the second embodiment. A two bit register is provided to each sense amplifier.

According to the fifth embodiment of the invention, NAND type cells each formed of two bit memory cells are repeatedly arranged in alignment in the column direction with NAND type cells placed opposite to each other relative to a bit line contact as a minimum unit. An empty region is formed between memory cell minimum units adjacent to each other in the column direction. Further, bit line contacts are shifted by two word lines in the column direction relative to the row direction. As a result, a read bit line and a reference bit line can be arranged with four bit lines as a unit for a sense amplifier, and sensing operation using the folded bit line arrangement can be performed. A memory cell occupation area per one bit is $5F^2$ in this case, and a memory cell arrangement suitable for higher integration is achieved.

When the NAND type cell is employed, if m memory cells each of the one transistor/one capacitor type are connected in series in one NAND type cell, leading word lines (selected word lines) can be classified using the residue system of $2 \cdot m+1$ and accordingly a read bit line and a reference bit line can be determined (when bit line contacts are periodically arranged with a unit of $2^m$ bit lines ($m \geq 2$) or $2^m \cdot 2$ bit lines (m=1)).

According to the present invention, multi-bit memory cells constitute a minimum unit and the memory cells are similarly arranged in a unit of prescribed number of word lines and bit lines relative to the row direction and the column direction. Further, bit line contacts are arranged to be shifted in the column direction relative to the row direction. As a result, a memory cell occupation area per one bit can be dramatically reduced to implement a highly integrated semiconductor memory device. Since the bit line contacts are arranged to be shifted, the read bit line and the reference bit line can be connected to the sense amplifier and a stable sensing operation is possible without being affected by noises.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device comprising:

a plurality of word lines each arranged extending in a row direction and in parallel to others;

a plurality of first bit lines each arranged extending in a column direction and in parallel to others;

a plurality of one transistor/one capacitor type memory cells arranged corresponding to crossing of said plurality of word lines and said plurality of first bit lines, units of two memory cells arranged repeatedly in the column direction, two memory cells being placed opposite to each other relative to a bit line contact for making a contact with a corresponding first bit line, bit line contacts for adjacent bit lines being periodically positioned differently, and the bit line contacts being periodically positioned in the row direction with a plurality of bit lines being a unit, the bit line contacts and the memory capacitors being arranged in alignment in the row direction with the plurality of bit lines being the unit;

a plurality of cell plate lines individually provided corresponding to the first bit lines and coupled to cell plate nodes of the memory cells on the corresponding first bit lines for transferring cell plate potentials to the cell plate nodes of the memory cells of corresponding first bit lines, the cell plate node being a capacitor electrode of a memory capacitor of the memory cell facing to a data storage node of the memory cell; and cell plate potential control circuit coupled to the cell plate lines for individually controlling the cell plate potentials on a cell plate line basis.

2. The semiconductor memory device according to claim 1, wherein the memory cell capacitors and the bit line contacts are arranged aligned between adjacent word lines.

3. The semiconductor memory device according to claim 1, wherein the memory cells are arranged such that two memory cells for three of the first bit lines as a unit are arranged in said row direction, two memory cells for three word lines as a unit are arranged in said column direction, and the memory cells are arranged in different patterns between adjacent bit lines and between adjacent word lines.

4. A semiconductor memory device comprising:

a plurality of word lines each arranged extending in a row direction and in parallel to others;

a plurality of first bit lines each arranged extending in a column direction and in parallel to others;

a plurality of memory cells arranged corresponding to crossing of said plurality of word lines and said plurality of first bit lines, each memory cell being a one transistor/one capacitor type memory cell, units of two memory cells being placed opposite to each other relative to a bit line contact for making a contact with a corresponding first bit line, bit line contacts for adjacent bit lines being positioned differently and the bit line contacts being periodically positioned in the row direction with a plurality of bit lines being a unit, wherein the memory cells are arranged such that two memory cells for three of the first bit lines as a unit are arranged in the row direction, two memory cells for three word lines as a unit are arranged in said column direction, and the memory cells are arranged in different patterns between adjacent bit lines and between adjacent word lines;

a plurality of cell plate lines individually provided corresponding to the first bit lines and coupled to cell plate nodes of the memory cells on the corresponding first bit lines for transferring cell plate potentials to the cell plate nodes of the memory cells of corresponding first bit lines, the cell plate node being a capacitor electrode of a memory capacitor of the memory cell facing to a data storage node of the memory cell; and cell plate potential control circuit coupled to the cell plate lines for individually controlling the cell plate potentials on a cell plate line basis.

5. A semiconductor memory device comprising:

a plurality of word lines, each arranged extending in a row direction and in parallel to others;

a plurality of first bit lines, each arranged extending in a column direction and in parallel to others; and a plurality of memory cells arranged corresponding to crossings of said plurality of word lines and said plurality of first bit lines, each memory cell being a one transistor/one capacitor type memory cell, units of two memory cells being placed opposite to each other relative to a bit line contact for making a contact with a corresponding first bit line, bit line contacts for adjacent bit lines being positioned differently, and the bit line contacts being periodically positioned in the row direction with a plurality of bit lines being a unit, a plurality of first sense amplifiers one provided for three of the first bit lines, the three first bit lines constituting a set;

a sense amplifier select connect circuit activated before a word line selection, for connecting two of said three first bit lines in each to a corresponding sense amplifier in accordance with a row designation signal;

a bit line potential control circuit activated before the word line selection and connected to each of the first bit lines, for setting a potential of one first bit line different from the two first bit lines connected to said corresponding sense amplifier in each of the sets to be higher than a prescribed voltage level in accordance with said row designation signal; and a cell plate voltage control circuit activated before the word line selection, for setting potentials of cell plate nodes facing to data storage nodes of capacitors of memory cells respectively provided corresponding to one of said two first bit lines connected to said corresponding sense amplifier and to said one first bit line to be higher than said prescribed voltage in accordance with said row designation signal.

6. A semiconductor memory device comprising:

a plurality of word lines, each arranged extending in a row direction and in parallel to others;

a plurality of first bit lines, each arranged extending in a column direction and in parallel to others;

a plurality of memory cells arranged corresponding to crossings of said plurality of word lines and said plurality of first bit lines, each memory cell being a one transistor/one capacitor type memory cell, units of two memory cells being placed opposite to each other relative to a bit line contact for making a contact with a corresponding first bit line, bit line contacts for adjacent bit lines being positioned differently, and the bit line contacts being periodically positioned in the row direction with a plurality of bit lines being a unit;

a plurality of first sense amplifiers placed on one side of said plurality of first bit lines, said plurality of first sense amplifiers provided one for three of the first bit lines;

read inhibition circuitry for changing voltages, before a word line selection, to allow memory cell data to be read onto one of two first bit lines connected to memory cells on an addressed row and to inhibit reading of memory cell data onto the other of said two first bit lines in each set formed of the three first bit lines in accordance with a row designation signal, the voltages to be changed being a voltage of said the other of the two first bit lines and a voltage of a cell plate node facing to a data storage node of a memory cell connected to said the other of the two first bit lines; and sense amplifier select connect circuitry for connecting said one of the two first bit lines and a remaining first bit line in each set of the first bit lines to a corresponding first sense amplifier in accordance with said row designation signal.

7. The semiconductor memory device according to claim 6, wherein said sense amplifier select connect circuitry include means for connecting a specific one of the three first bit lines in each said set to a corresponding first sense amplifier or an adjacent first sense amplifier provided for an adjacent set.

8. The semiconductor memory device according to claim 4, further comprising a plurality of second bit lines arranged alternately with the first bit lines, and a plurality of memory cells provided corresponding to said plurality of second bit lines respectively and arranged similarly to the memory cells corresponding to the first bit lines, wherein said read inhibition circuitry includes means for controlling the bit line voltage and cell plate node voltage in a unit of adjacent first and second bit lines.

9. The semiconductor memory device according to claim 8, further comprising a plurality of second sense amplifiers placed on other side opposite to said one side of said plurality of first and second bit lines, the second provided one for three of the second bit lines, wherein said sense amplifier select connect circuitry include means responsive to said row designation signal for implementing connection between said plurality of second bit lines and corresponding second sense amplifiers in a manner similar to a manner in which said plurality of first bit lines and said plurality of first sense amplifiers are connected.

10. A semiconductor memory device comprising:

a plurality of word lines extending in a row direction and arranged in parallel to each other;

a plurality of first bit lines extending in a column direction and arranged in parallel to each other; and a plurality of first NAND type cells arranged in rows and columns each of the first NAND type cells having $2^n$ one transistor/one capacitor type memory cells connected in series, wherein bit line contacts for contacting the first bit lines to said plurality of first NAND type cells are arranged at the same position in the row direction every first bit lines of a prescribed number of $2^n$ or $2 \cdot 2^n$, and the bit line contacts are differently positioned for word lines adjacent to each other and for first bit lines adjacent to each other.

11. The semiconductor memory device according to claim 10, wherein a unit structure formed of two of NAND type cells is repeatedly arranged in said column direction, said two of NAND type cells placed opposite to each other relative to a bit line contact for making a contact with a corresponding first bit line.

12. The semiconductor memory device according to claim 10, further comprising:

a plurality of first sense amplifiers arranged corresponding to respective sets each having a prescribed number of the first bit lines;

cell plate voltage control circuitry according to a row designation signal for setting voltage of a cell plate node of a capacitor of a memory cell connected to each of the first bit lines so as to allow memory cell data to be read onto one of the first bit lines of each of the sets and to inhibit reading of memory cell data onto remaining first bit lines of each of the sets, said voltage set individually for each of the first bit lines;

bit line voltage control circuitry for setting a voltage of each of the first bit lines individually according to said row designation signal so as to allow memory cell data to be read onto said one of the first bit lines in each of the sets and to inhibit reading of memory cell data onto remaining first bit lines in each of the sets; and sense amplifier select connect circuitry responsive to said row designation signal for connecting the one first bit line in each of the sets and one of the remaining first bit lines in each of the sets to a corresponding one of the first sense amplifiers.

13. The semiconductor memory device according to claim 10, wherein said bit line contacts are arranged to be shifted by a pitch of two word lines in the column direction in each of the sets.

14. The semiconductor memory device according to claim 12, further comprising:

second bit lines arranged alternately with said first bit lines; and a plurality of second NAND type cells provided corresponding to the second bit lines and connected to corresponding second bit lines via bit line contacts arranged in an arrangement pattern similar to that of said plurality of first NAND type cells, wherein cells connected to first and second bit lines adjacent to each other are provided with the same bit line contact arrangement pattern and share a cell plate voltage transmission line supplying a voltage to a cell plate node.

15. The semiconductor memory device according to claim 12, wherein said bit line voltage control circuitry include means for controlling voltages of the second bit lines in a manner similar to that for controlling the voltages of the first bit lines in accordance with said row designation signal.

16. The semiconductor memory device according to claim 12, further comprising a plurality of second sense amplifiers arranged opposite to said plurality of first sense amplifiers relative to first and second bit lines and arranged corresponding to respective sets each having a prescribed number of second bit lines of said plurality of second bit lines, wherein said sense amplifier select connect circuitry include means for implementing connection between the second bit lines and the second sense amplifiers in a manner similar to a manner in which the first sense amplifiers and the first bit lines are connected in accordance with said designation signal.

* * * * *

UNITED STATES PATENT AND TRADEMARK OFFICE
CERTIFICATE OF CORRECTION

PATENT NO.   : 6,151,244
DATED        : November 21, 2000
INVENTOR(S)  : Takeshi Fujino et al.

It is certified that error appears in the above-identified patent and that said Letters Patent is hereby corrected as shown below:

Column 32, claim 1,
Line 60, change "crossing" to -- crossings --;

Column 33, claim 4,
Line 44, change "lines" to -- line --;

Column 33, claim 5,
Line 67, delete "and" (second instance);

Column 34,
Line 10, change "," to -- ; --;
Line 16, after "each", insert -- set --;
Line 31, after "voltage", insert -- level --;

Column 36, calim 16,
Line 55, after "accordance with said", insert -- row --.

Signed and Sealed this

Eighteenth Day of December, 2001

Attest:

*Attesting Officer*

JAMES E. ROGAN
*Director of the United States Patent and Trademark Office*

UNITED STATES PATENT AND TRADEMARK OFFICE
CERTIFICATE OF CORRECTION

PATENT NO. : 6,151,244
DATED : November 21, 2000
INVENTOR(S) : Takeshi Fujino et al.

It is certified that error appears in the above-identified patent and that said Letters Patent is hereby corrected as shown below:

Column 32, claim 1,
Line 60, change "crossing" to -- crossings --;

Column 33, claim 4,
Line 44, change "lines" to -- line --;

Column 33, claim 5,
Line 67, delete "and" (second instance);

Column 34,
Line 10, change "," to -- ; --;
Line 16, after "each", insert -- set --;
Line 31, after "voltage", insert -- level --;

Column 36, claim 16,
Line 55, after "accordance with said", insert -- row --.

This certificate supersedes Certificate of Correction issued December 18, 2001.

Signed and Sealed this

Twenty-sixth Day of February, 2002

*Attest:*

JAMES E. ROGAN
*Attesting Officer*    *Director of the United States Patent and Trademark Office*